United States Patent
Yang et al.

(10) Patent No.: US 11,683,015 B2
(45) Date of Patent: Jun. 20, 2023

(54) CLASS-D AMPLIFIER WITH DEADTIME DISTORTION COMPENSATION

(71) Applicant: QUALCOMM Incorporated, San Diego, CA (US)

(72) Inventors: ChienChung Yang, San Diego, CA (US); Dongyang Tang, San Diego, CA (US); Sherif Galal, Irvine, CA (US); Xinwang Zhang, San Diego, CA (US); Subbarao Surendra Chakkirala, San Jose, CA (US); Pradeep Silva, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/404,862

(22) Filed: Aug. 17, 2021

(65) Prior Publication Data

US 2023/0058434 A1 Feb. 23, 2023

(51) Int. Cl.
*H03F 1/32* (2006.01)
*H03F 3/217* (2006.01)

(52) U.S. Cl.
CPC ......... *H03F 1/3205* (2013.01); *H03F 3/2173* (2013.01); *H03F 2200/03* (2013.01); *H03F 2200/165* (2013.01); *H03F 2200/351* (2013.01)

(58) Field of Classification Search
CPC .. H03F 1/3205; H03F 3/2173; H03F 2200/03; H03F 2200/165; H03F 2200/351
USPC ........................................ 330/10, 251, 207 A
See application file for complete search history.

(56) References Cited

U.S. PATENT DOCUMENTS

| 7,728,658 B2 * | 6/2010 | Andersen .............. H03F 1/3258 381/120 |
| 2010/0201443 A1 | 8/2010 | Kaya et al. |
| 2016/0006402 A1 | 1/2016 | Kaya |
| 2018/0331682 A1 | 11/2018 | Duduman et al. |

FOREIGN PATENT DOCUMENTS

EP    3567722 A1    11/2019

OTHER PUBLICATIONS

Partial International Search Report—PCT/US2022/038141—ISA/EPO—dated Oct. 28, 2022.
International Search Report and Written Opinion—PCT/US2022/038141—ISA/EPO—dated Dec. 21, 2022.

* cited by examiner

*Primary Examiner* — Hieu P Nguyen
(74) *Attorney, Agent, or Firm* — Loza & Loza LLP

(57) ABSTRACT

A class-D amplifier including a pulse width modulator including an input configured to receive a first signal based on an input signal, and an output configured to generate a pulse width modulated (PWM) signal; an H-bridge including an input coupled to an output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal. The deadtime compensation circuit may be a feedback circuit between an output of the H-bridge and an input of the pulse width modulator, a pulse modification circuit at the output of the pulse width modulator, or an offset signal generating circuit providing an offset signal to the pulse width modulator.

27 Claims, 8 Drawing Sheets

CLASS-D AMPLIFIER WITH DEADTIME DISTORTION COMPENSATION

FIELD

Aspects of the present disclosure relate generally to signal amplifiers, and in particular, to a class-D amplifier with deadtime distortion compensation.

BACKGROUND

A class-D amplifier is a power efficient amplifier with an output stage four (4) transistors in an H-configuration with a load being at the horizontal segment of the H. The output stage is often referred to as an H-bridge. To generate a positive load current $+I_L$ (e.g., flowing from left-to-right through the load), the transistors on the top-left and bottom-right segments of the H-bridge are turned on, while the transistors on the top-right and bottom-left segments of the H-bridge are turned off. Similarly, to generate a negative load current $-I_L$ (e.g., flowing from right-to-left through the load), the transistors on the top-right and bottom-left segments of the H-bridge are turned on, while the transistors on the top-left and bottom-right segments of the H-bridge are turned off.

A driver controlling the transistors of an H-bridge may ensure that no shoot-through current occurs during the operation of the H-bridge. A shoot-through current occurs when both top- and bottom-left transistors or the top- and bottom-right transistors are turned on at the same time. In such case, a very low resistance path or short is created between an upper voltage rail and a lower voltage rail, resulting in significantly high current flowing through the H-bridge. This has the adverse consequences of the H-bridge consuming significant power and the high current may damage to the transistors. To prevent shoot-through current, the driver may insert deadtime where substantially no current if flowing between the upper and lower voltage rails. However, the resulting output voltage across the load may be distorted due to the deadtime.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a pulse width modulator including an input configured to receive a first signal based on an input signal, and an output configured to generate a pulse width modulated (PWM) signal; an H-bridge including an input coupled to an output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal, wherein the deadtime compensation circuit is coupled between the output of the H-bridge and the input of the pulse width modulator, and wherein the deadtime compensation circuit includes: a first signal subtractor including a first input coupled to the output of the H-bridge, and a second input coupled to the output of the pulse width modulator; a low pass filter including an input coupled to an output of the first signal subtractor; and a signal scalar including an input coupled to an output of the low pass filter and an output coupled to the input of the pulse width modulator.

Another aspect of the disclosure relates to a method. The method includes generating a pulse width modulated signal based on an input signal; generating an output signal across a load based on the pulse width modulated signal; and modifying the output signal to compensate for deadtime distortion in the output signal.

Another aspect of the disclosure relates to an apparatus. The apparatus includes means for generating a pulse width modulated signal based on an input signal; means for generating an output signal across a load based on the pulse width modulated signal; and means for modifying the output signal to compensate for deadtime distortion in the output signal.

Another aspect of the disclosure relates to an apparatus. The apparatus includes a pulse width modulator including an input configured to receive a first signal based on an input signal, and an output configured to generate a pulse width modulated (PWM) signal; an H-bridge including an input coupled to an output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal, wherein the deadtime compensation circuit includes a pulse modification circuit including an input coupled to the output of the pulse width modulator and an output coupled to an input of an H-bridge driver, wherein the H-bridge driver includes an output coupled to the input of the H-bridge.

Another aspect of the disclosure relates to a wireless communication device. The wireless communication device includes an audio codec configured to generate an audio signal; a class-D amplifier, including: a pulse width modulator including an input configured to receive a first signal based on the audio signal, and an output configured to generate a pulse width modulated (PWM) signal; an H-bridge including an input coupled to an output of the pulse width modulator and an output coupled to a speaker, wherein the H-bridge is configured to generate an output signal across the speaker based on the PWM signal; and a deadtime compensation circuit coupled to the H-bridge, wherein the deadtime compensation circuit is configured to compensate for deadtime distortion in the output signal; a signal processor configured to generate or process a baseband signal; a transceiver configured to generate a radio frequency signal based on the baseband signal or process the baseband signal to generate the radio frequency signal; and at least one antenna configured to wirelessly transmit or receive the radio frequency signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
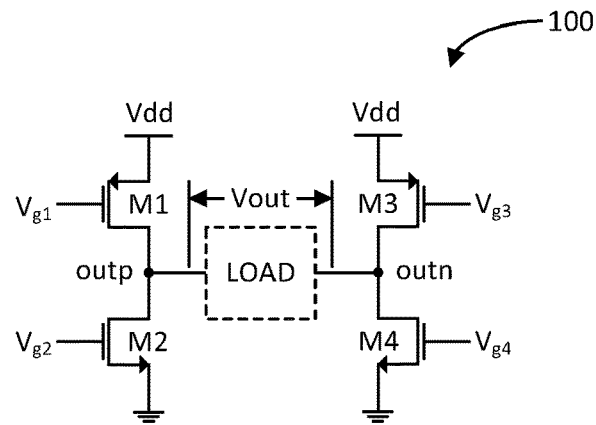
FIG. 1A illustrates a schematic diagram of an example H-bridge of a class-D amplifier in accordance with an aspect of the disclosure.

FIG. 1A illustrates a schematic diagram of an example output stage or H-bridge 100 of a class-D amplifier in accordance with an aspect of the disclosure. The H-bridge 100 includes first and second switching devices M1 and M2 coupled in series between an upper voltage rail Vdd and a lower voltage rail (e.g., ground). The H-bridge 100 further includes third and fourth switching devices M3 and M4 coupled in series between the upper voltage rail Vdd and the lower voltage rail (e.g., ground). Each of the switching devices M1-M4 may be implemented as a field effect transistor (FET). For example, as depicted, the switching devices M1 and M3 may be implemented as p-channel metal oxide semiconductor (PMOS) FETs, and the switching devices M2 and M4 may be implemented as n-channel metal oxide semiconductor (NMOS) FETs. However, other FET configurations are possible, such as all FETs M1-M4 being implemented as NMOS FETs.

Control voltages or signals (e.g., gate voltages) $V_{g1}$-$V_{g4}$ are applied to the gates of FETs M1-M4, respectively. The control signals $V_{g1}$-$V_{g4}$ may be generated by an H-bridge driver (not shown in FIG. 1A). A load may be coupled between the drains (outp) of the FETs M1 and M2 and the drains (outn) of FETs M3 and M4. An output signal Vout (e.g., an output voltage) is taken across the load or across nodes outp and outn. The load may be any devices that operates based on the output signal Vout, such as an audio speaker, a motor, a battery, robotic circuitry, and others. Additionally, a low pass filter (LPF) (e.g., a resistor in series with an inductor) may be coupled to the load between the output nodes outp and outn. The operation of the H-bridge 100 is discussed with reference to waveform diagrams of the control signals $V_{g1}$-$V_{g4}$ and the output signal Vout.

Figure 1B:
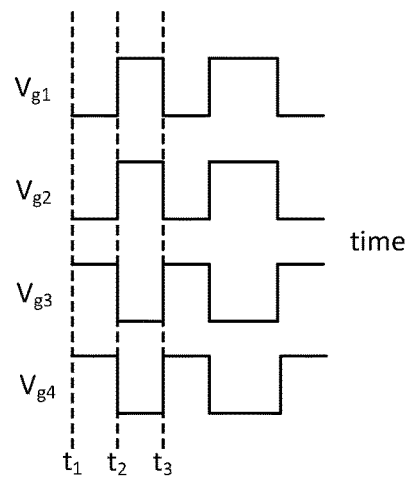
FIG. 1B illustrates a diagram of example control signals for an ideal operation of the H-bridge of FIG. 1A in accordance with another aspect of the disclosure.

FIG. 1B illustrates a diagram of example control signals $V_{g1}$-$V_{g4}$ for an ideal operation of the H-bridge 100 in accordance with another aspect of the disclosure. The diagram depicts the control signals $V_{g1}$-$V_{g4}$ from top to bottom in that order. The horizontal axis represents time, and the vertical axis represents logical states or amplitudes of the control signals $V_{g1}$-$V_{g4}$.

As illustrated, during time interval $t_1$-$t_2$, the control signals $V_{g1}$-$V_{g4}$ are at low, low, high, and high states, respectively. The control signal $V_{g1}$ being low turns on FET M1, the control signal $V_{g2}$ being low turns off FET M2, the control signal $V_{g3}$ being high turns off FET M3, and the control signal $V_{g4}$ being high turns on FET M4. Accordingly, because of the inductive load, FETs M1 and M4 being the only FETs turned on causes an increase in a slope of a positive load current $+I_L$ flowing from output node outp to output node outn through the load, or a decrease in a slope of a negative load current $-I_L$ flowing from output node outn to output node outp through the load.

During time interval $t_2$-$t_3$, the control signals $V_{g1}$-$V_{g4}$ are at high, high, low, and low states, respectively. The control signal $V_{g1}$ being high turns off FET M1, the control signal $V_{g2}$ being high turns on FET M2, the control signal $V_{g3}$ being low turns on FET M3, and the control signal $V_{g4}$ being low turns off FET M4. Accordingly, FETs M2 and M3 being the only FETs turned on causes an increase in a slope of a negative load current $-I_L$ flowing from output node outn to output node outp through the load, or a decrease in a slope of a positive load current $+I_L$ flowing from output node outp to output node outn through the load.

The positive and negative currents flow through the load is based on an input signal (not shown in FIG. 1A). As discussed further herein, an H-bridge driver generates the control signals $V_{g1}$-$V_{g4}$ based on the input signal. If the input signal is sinusoidal, then the output signal Vout is sinusoidal; and the output signal Vout is said to have low total harmonic distortion (THD). The low pass filter inherent in the load and/or coupled to the load removes high frequency components resulting from the switching operation of the FETs M1-M4.

An adverse condition may occur if the control signals $V_{g1}$-$V_{g4}$ are not generated in a time-precise manner. For example, at time $t_2$, if the control signal $V_{g2}$ goes to the high state early (before the control signal $V_{g1}$ goes to the high state), then both FETs M1 and M2 are turned on at the same time; thereby, essentially causing a short between the upper voltage rail Vdd and the lower voltage rail (e.g., ground). Such short produces a high current through the FETs M1 and M2, which causes the H-bridge 100 to consume significant power and may also cause damage to the FETs M1 and M2. Similarly, at time $t_3$, if the control signal $V_{g4}$ goes to the high state early (before the control signal $V_{g3}$ goes to the high state), then both FETs M3 and M4 are turned on at the same time, resulting in a similar high current through the FETs M3 and M4. Such high current is referred to as a shoot-through current.

Figure 1C:
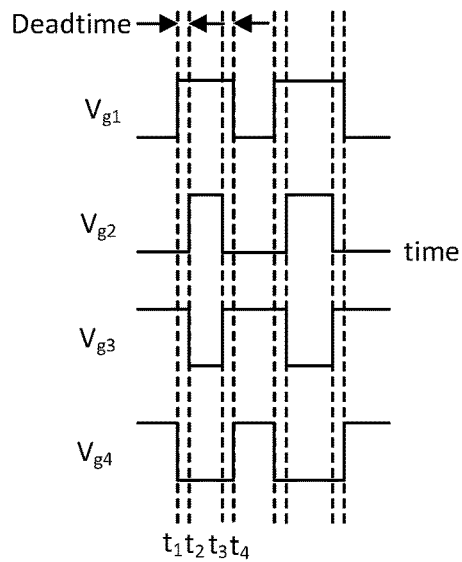
FIG. 1C illustrates a diagram of example control signals for deadtime insertion operation of the H-bridge of FIG. 1A in accordance with another aspect of the disclosure.

FIG. 1C illustrates a diagram of example control signals for deadtime insertion operation of the H-bridge 100 in accordance with another aspect of the disclosure. To prevent shoot-through current, an H-bridge driver is configured to insert deadtime on the positive-side of the H-bridge (e.g., FETs M1 and M2) or the negative-side of the H-bridge (e.g., FETs M3 and M4) at a particular time. The operation of the H-bridge driver is often referred to as break-before-make (BBM) operation. That is, the H-bridge driver breaks the connection between the upper voltage rail Vdd and the lower voltage rail (e.g., ground) via inverter M1/M2 or M3/M4 prior to commencing the regulation of the load current in the next cycle. Thus, the BBM operation prevents shoot-through current, which, as discussed, causes the class-D amplifier to consume significant power and may cause damage to the H-bridge devices.

Similar to FIG. 1B, the timing diagram of the control signals $V_{g1}$-$V_{g4}$ is shown in FIG. 1C. As the timing diagram shows, prior to time $t_1$, the control signals $V_{g1}$-$V_{g4}$ are at low, low, high, and high states; and as discussed above, this results in an increase in a positive load current $+I_L$ or a decrease in a negative load current $-I_L$, as the FETs M1 and M4 are turned on, and FETs M2 and M3 are turned off. To prevent shoot-through current via the positive-side or negative-side of the H-bridge, the FET M1 or M4 (that produce an increasing $+I_L$ or decreasing $-I_L$) are turned off first at time $t_1$, and then the FET M2 or M3 (that produces an increasing $-I_L$ or decreasing $+I_L$) are turned on later at time $t_2$, respectively. Thus, the time interval $t_1$-$t_2$ is known as a deadtime. Similarly, at time $t_3$, the FET M2 or M3 (that produce an increasing $-I_L$ or decreasing $+I_L$) are turned off, and then at a later time $t_4$, the FET M1 or M4 (that produces an increasing $+I_L$ or decreasing $-I_L$) are turned on, respectively. Thus, the time interval $t_3$-$t_4$ is another deadtime to prevent shoot-through current.

The deadtimes to prevent shoot-through current has an adverse consequence of producing distortion in the output signal Vout, which may be measured or quantized by the total harmonic distortion (THD) in the output signal Vout, which is related to the sum of the powers of all harmonic components to the power of the fundamental frequency. The fundamental frequency relates to the frequency of the input signal to the class-D amplifier 100. A lower THD means that the output signal Vout has less and/or lower harmonic components, and thus, less distortion. A higher THD means that the output signal Vout has more and/or higher harmonic components, and thus, more distortion.

Figure 2A:
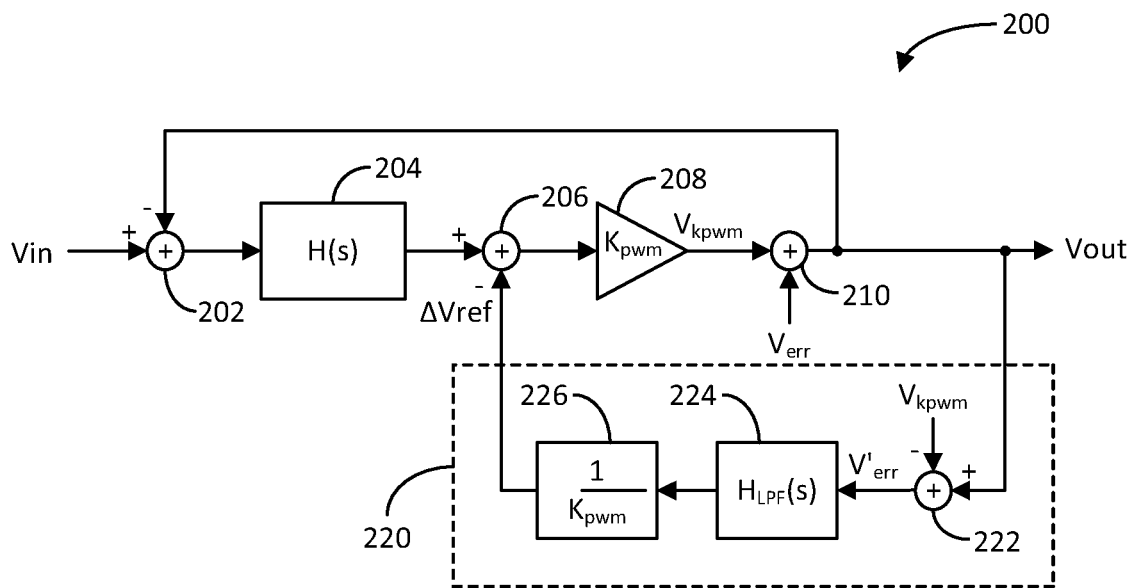
FIG. 2A illustrates a block diagram of an example class-D amplifier in accordance with another aspect of the disclosure.

FIG. 2 illustrates a block diagram of an example class-D amplifier 200 in accordance with another aspect of the disclosure. As discussed in more detail further herein, the class-D amplifier 200 implements the BBM operation of the H-bridge to prevent shoot-through current, but further includes circuitry to reduce or compensate for the distortion in the output signal Vout produced by the deadtimes. Although in this example, the class-D amplifier 200 is shown to be single-ended, it shall be understood that each of the signals or connections between components may be differential.

More specifically, the class-D amplifier 200 includes a first signal subtractor 202, a loop filter 204, a second signal subtractor 206, a pulse width modulator (PWM) 208, and an H-bridge/driver 210 (represented as a signal summer). The class-D amplifier 200 further includes a deadtime compensation circuit 220 including a third signal subtractor 222, a low pass filter (LPF) 224, and a signal (e.g., voltage) scalar 226. It shall be understood that a signal summer and a signal subtractor as described herein are equivalent depending on whether both inputs have been configured with the same polarity or opposite polarity (as indicated).

The first signal subtractor 202 includes a first (positive) input configured to receive an input voltage Vin and a second (negative) input configured to receive an output signal Vout of the class-D amplifier 200. The first signal subtractor 202 includes an output coupled to an input of the loop filter 204. The loop filter 204, which may be implemented as one or more cascaded integrators or low pass filters (LPFs) as exemplified further herein, may be configured to improve the linearity of the output signal Vout by integrating or low pass filtering the difference between the input and output signals (e.g., Vin-Vout). The loop filter 204, which has a transfer function represented as H(s), includes an output coupled to a first (positive) input of the second signal subtractor 206.

The second signal summer 206 includes a second (negative) input coupled to an output of the deadtime compensation circuit 220, and an output coupled to an input of the pulse width modulator 208. The pulse width modulator 208 is configured to generate a pulse width modulator (PWM) signal $V_{kpwm}$ based on a signal produced by the second signal subtractor 206 amplified with a pulse width modulation gain represented as $K_{PWM}$. The pulse width modulator 208 includes an output coupled to a first input of the signal summer 210 representing an H-bridge driver and H-bridge (referred to herein as H-bridge/driver). Although not shown in FIG. 2, a load is coupled to the H-bridge/driver 210, as in FIG. 1A. As discussed above, the operation of the H-bridge adds distortion to the output signal Vout due to the insertion of deadtimes. Accordingly, the distortion may be presented as a signal (e.g., voltage) error $V_{err}$. As illustrated, the signal summer 210 includes a second input to receive the signal error $V_{err}$, and an output to produce the output signal Vout. As further illustrated, the output of the H-bridge/driver 210 is coupled to the second (negative) input of the first signal subtractor 202.

With regard to the deadtime compensation circuit 220, the third signal subtractor 222 includes a first (positive) input coupled to an output of the H-bridge/driver 210 and configured to receive the output signal Vout. The third signal subtractor 222 includes a second (negative) input coupled to the output of the pulse width modulator 208, and configured to receive the PWM signal $V_{kpwm}$. As the output signal Vout may be represented as the sum of the PWM signal $V_{kpwm}$ and the deadtime distortion signal error $V_{err}$, the signal subtraction performed by the third signal subtractor 222 causes the third signal subtractor 222 to output substantially the deadtime distortion error signal V'err. The output of the third signal subtractor 222 is coupled to an input of the low pass filter (LPF) 224, which is configured to low pass filter the deadtime distortion error signal V'err with a transfer function $H_{LPF}(s)$ to remove high frequency components thereof.

The low pass filter 224 includes an output coupled to the signal scalar 226, which is configured to scale the low pass filtered error signal V'err by one over the pulse width modulation gain $K_{pwm}$ of the pulse width modulator 208. The signal scalar 226 includes an output coupled to the second (negative) input of the second signal subtractor 206. The signal scalar 226 is configured to generate a signal (e.g., voltage) ΔVref to adjust the reference signal (e.g., voltage) or comparison made at the input of the pulse width modulator 208. For example, the signal ΔVref may adjusts the reference signal, the triangle carrier or modulation signal, and/or the loop filtered input signal to the pulse width modulator 208. Thus, the deadtime compensation circuit 220 is configured to adjust the signal comparison at the input of the pulse width modulator 208 such that PWM signal $V_{kpwm}$ is based on the negative error signal V'err, which effectively cancels out the deadtime distortion error $V_{err}$ introduced by the H-bridge/driver 210.

The transfer function of the class-D amplifier 200 may be represented by the following equation:

$$Vout = \frac{[H(s) * K_{pwm}]}{[1 + K_{pwm} * H(s)]} * Vin + \frac{1 - H_{LPF}(s)}{[1 + K_{pwm} * H(s)]} * V_{err}$$

As the equation demonstrates, at low frequencies (which is the interested bandwidth), when $H_{LPF}(s)$ is substantially one (1), the signal error $V_{err}$ in the output signal Vout is cancelled due to numerator $(1-H_{LPF}(s))$ of the second term of the equation.

Figure 2B:
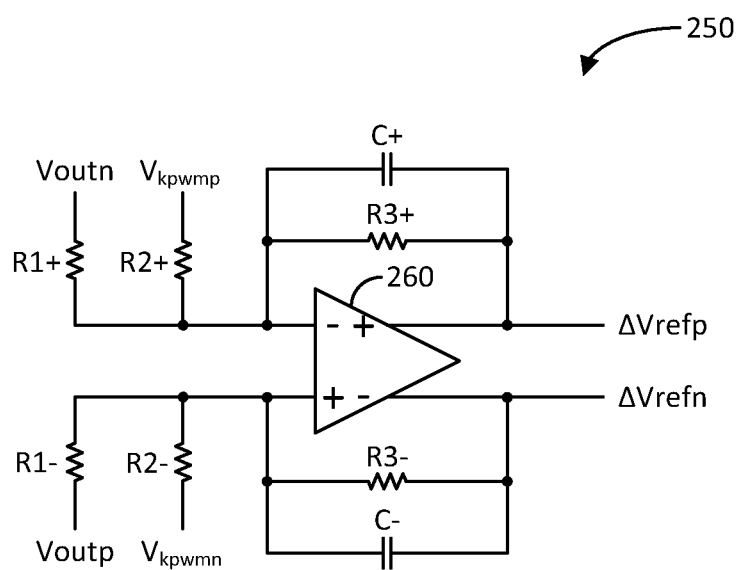
FIG. 2B illustrates a schematic diagram of an example deadtime compensation circuit in accordance with another aspect of the disclosure.

FIG. 2B illustrates a schematic diagram of an example deadtime compensation circuit 250 in accordance with another aspect of the disclosure. The deadtime compensation circuit 250 may be an example of a more detailed implementation of the deadtime compensation circuit 220 of class-D amplifier 200 previously discussed.

The deadtime compensation circuit 250 includes an operational amplifier 260 with differential input and output. The deadtime compensation circuit 250 includes a first input resistor R1+ coupled between the negative output (outn) of the H-bridge 210 (to receive the negative component of a differential output signal (e.g., voltage), Voutn) and a negative input of the operational amplifier 260; a second input resistor R1− coupled between the positive output (outp) of the H-bridge 210 (to receive the positive component of the differential output signal, Voutp) and a positive input of the operational amplifier 260; a third input resistor R2+ coupled between the positive output of the pulse width modulator 208 (to receive the positive component of the differential PWM signal, $V_{kpwmp}$) and the negative input of the operational amplifier 260; and a fourth input resistor R2− coupled between the negative output of the pulse width modulator 208 (to receive the negative component of the differential PWM signal, $V_{kpwmn}$) and the positive input of the operational amplifier 260. Thus, the resistors R1+ and R1− and R2+ and R2− are configured to subtract the PWM signal $V_{kpwnp}/V_{kpwnn}$ from the output signal Voutp/Voutn, as described with reference to signal subtractor 222.

The deadtime compensation circuit 250 further includes feedback resistors R3+ and R3−, and feedback capacitors C+ and C−. The feedback R3+ resistor and capacitor C+ are coupled in parallel between a positive output and the negative input of the operational amplifier 260. The feedback resistor R3− and capacitor C− are coupled in parallel between a negative output and the positive input of the operational amplifier 260. The operational amplifier 260 is configured to generate a differential deadtime compensation signal (e.g., voltage) ΔVrefp/ΔVrefn. As discussed above, the differential deadtime compensation signal ΔVrefp/ΔVrefn is used to affect the input signal comparison of the pulse width modulator 208 to reduce the deadtime distortion from the output signal Vout.

Comparing the deadtime compensation circuit 250 to that of deadtime compensation circuit 220, the resistors R1+, R1−, R2+, and R2− operate as the signal subtractor 222 to produce a differential error signal (e.g., voltage) V' err at the input of the differential operational amplifier 260. The operational amplifier 260 including the feedback resistors R3+/R3− and capacitors C+/C− operate as the low pass filter 224 and the signal scalar 226. That is, by properly selecting the resistance and capacitance of the feedback resistors R3+/R3− and capacitors C+/C−, the desired filter transfer function $H_{LPF}(s)$ and signal (e.g., voltage) scaling factor $1/K_{pwm}$ may be achieved.

Figure 3A:
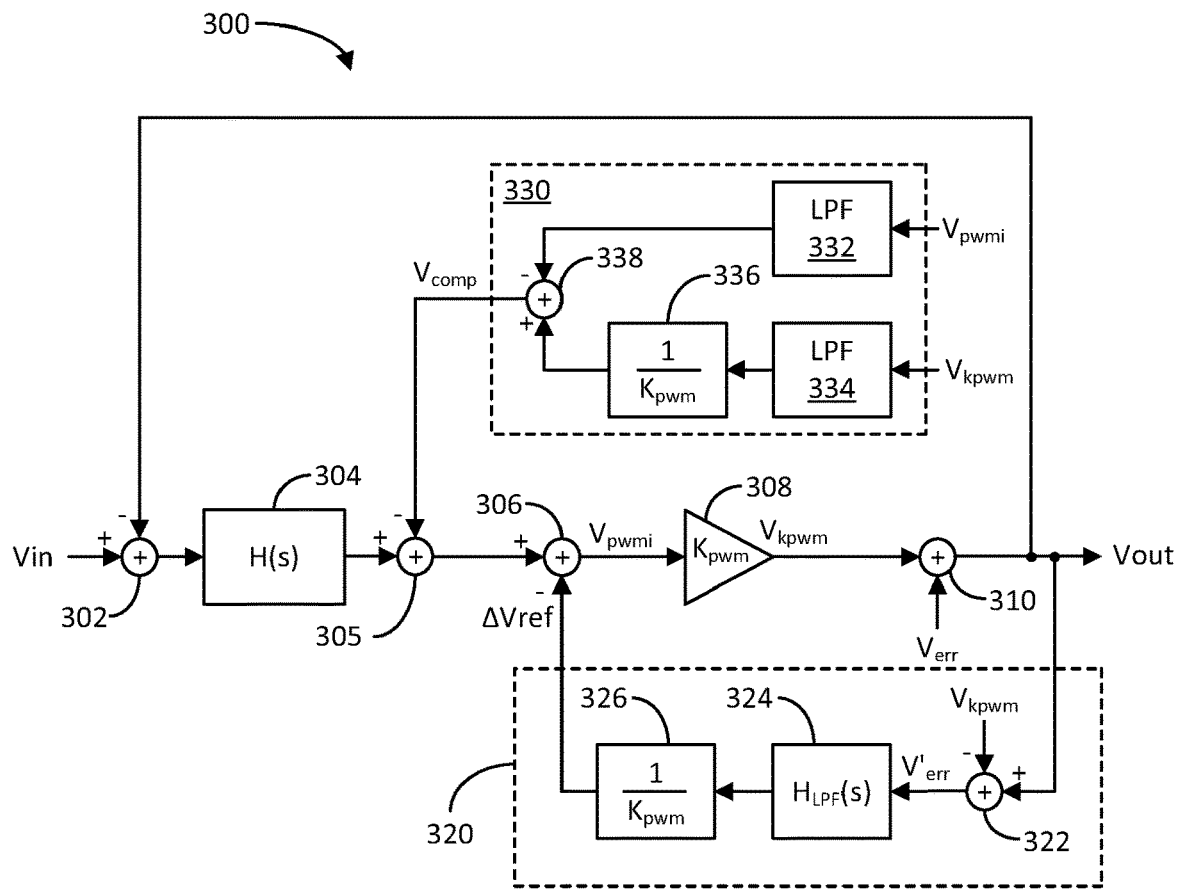
FIG. 3A illustrates a block diagram of another example class-D amplifier in accordance with another aspect of the disclosure.

FIG. 3A illustrates a block diagram of another example class-D amplifier 300 in accordance with another aspect of the disclosure. The class-D amplifier 300 may be a variation of class-D amplifier 200 previously discussed, and include many similar elements as indicated by the same reference numbers with the exception that the most significant digit is a "3" in class-D amplifier 300 instead of a "2" in class-D amplifier 200.

The class-D amplifier 300 further includes an aliasing error compensation circuit 330 including a first low pass filter (LPF) 332, a second LPF 334, a signal (e.g., voltage) scaling device 336, and a first subtractor 338. The aliasing error compensation circuit 330 may further include or be associated with a second subtractor 305. The first LPF 332 includes an input coupled to the input of the pulse width modulator 308 to receive an input signal $V_{pwmi}$ to the pulse width modulator signal 308. The second LPF 334 includes an input coupled to the output of the pulse width modulator 308 to receive the pulse width modulated signal $V_{kpwm}$.

The LPFs 332 and 334 are configured to remove or reduce high frequency components in the signals $V_{pwmi}$ and $V_{kpwm}$, respectively. The signal scaling device 336 is configured to scale the filtered signal $V_{kpwm}$ by substantially one over the gain $K_{pwm}$ of the pulse width modulator 308 so that both signals $V_{pwmi}$ and scaled $V_{kpwm}$ are in the same signal domain. The first subtractor 338 generates a compensation signal $V_{comp}$ based on a difference between the filtered and scaled PWM output signal $V_{kpwm}$ and the filtered PWM input signal $V_{pwmi}$. The second subtractor 305 takes the difference between the loop filtered input signal and the compensation signal $V_{comp}$, where the input signal $V_{pwmi}$ to the pulse width modulator signal 308 is based on such difference. Although the class-D amplifier 300 includes a deadtime compensation circuit 320, it shall be understood that the aliasing error compensation circuit 330 may be independent of the deadtime compensation circuit 320, and accordingly, the class-D amplifier 300 may include one, or the other, or both. The aliasing error compensation operates as follows.

Figure 3B:
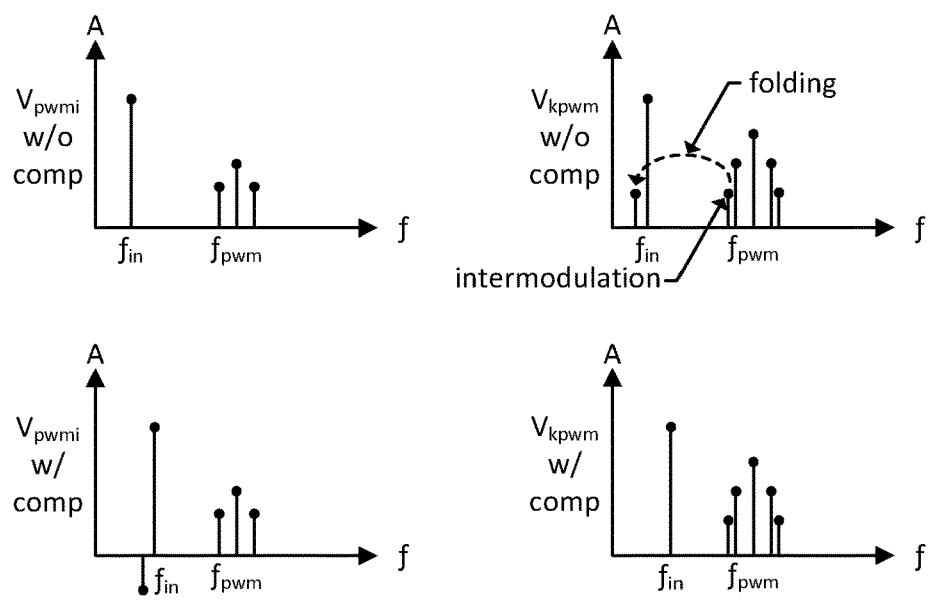
FIG. 3B illustrate graphs of example frequency spectrums of the uncompensated PWM input signal, uncompensated PWM output signal, compensated PWM input signal, and compensated PWM output signal in accordance with another aspect of the disclosure.

FIG. 3B illustrate graphs of example frequency spectrums of the uncompensated PWM input signal $V_{pwmi}$, uncompensated PWM output signal $V_{kpwm}$, compensated PWM input signal $V_{pwmi}$, and compensated PWM output signal $V_{kpwm}$ in accordance with another aspect of the disclosure. The x- or horizontal axis of each of the graphs represents frequency (f), and the y- or vertical axis represents magnitude or amplitude (A). The top-left, top-right, bottom-left, and bottom-right graphs represent the spectrums of the uncompensated PWM input signal $V_{pwmi}$, uncompensated PWM output signal $V_{kpwm}$, compensated PWM input signal $V_{pwmi}$, and compensated PWM output signal $V_{kpwm}$, respectively.

With regard to the uncompensated PWM input signal $V_{pwmi}$, its spectrum includes energy based on the input signal Vin, represented by the signal near the frequency $f_{in}$ (e.g., within an audio band). The spectrum also includes residual pulse width modulated signal products around the pulse width modulated carrier frequency $f_{pwm}$; the residual signal products coming from the output signal via the feedback loop. With regard to the uncompensated PWM output signal $V_{kpwm}$, the spectrum includes the input signal $f_{in}$ and the PWM signal products $f_{pwm}$. Additionally, the spectrum includes intermodulation products as indicated, and folded intermodulation products that ends up within the frequency band of the input signal $f_{in}$. It is these folded intermodulation products that may present distortion issues with regard to the output signal Vout.

By taking the difference between the filtered PWM input signal $V_{pwmi}$ and the filtered and scaled PWM output signal $V_{kpwm}$, the aliasing error compensation circuit 330 effectively removes all frequency components from the spectrum of the PWM output signal $V_{kpwm}$ except for the folded intermodulation products to generate the compensation signal $V_{comp}$ In response to the second subtractor 305 taking the difference between the loop filtered input signal and the compensation signal $V_{comp}$, the spectrum of the compensated PWM input signal $V_{pwmi}$ includes a negative of the folded intermodulation products. Thus, the negative folded intermodulation products substantially cancel out the folded intermodulation products in the PWM output signal $V_{kpwm}$; thereby, reducing error in the output signal Vout due to aliasing.

Figure 4A:
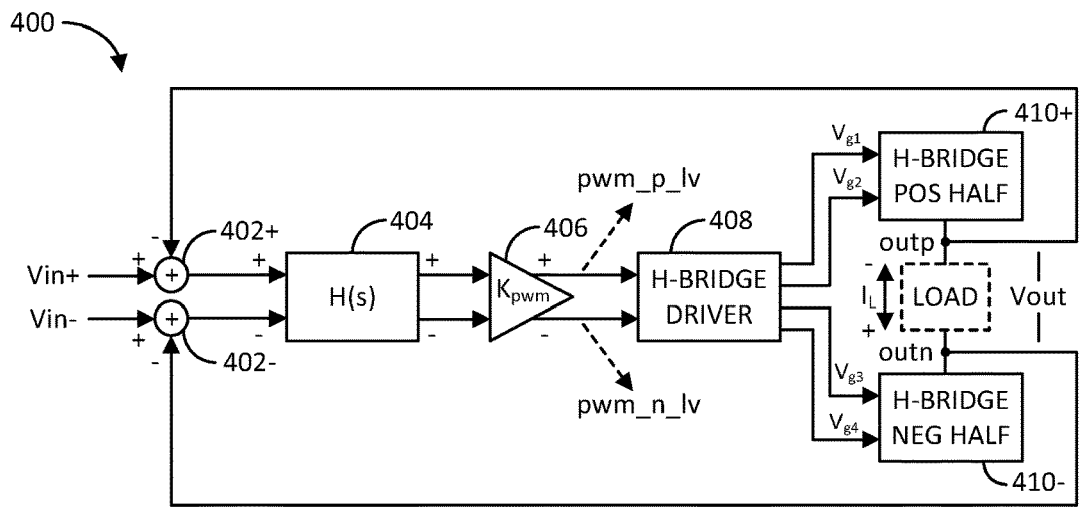
FIG. 4A illustrates a block/schematic diagram of an example class-D amplifier in accordance with another aspect of the disclosure.

FIG. 4A illustrates a block/schematic diagram of an example class-D amplifier 400 in accordance with another aspect of the disclosure. The class-D amplifier 400 includes first and second signal (e.g., voltage) subtractors 402+ and 402−(e.g., differential signal subtractor), a differential loop filter H(s) 404, a differential pulse width modulator (PWM) 406, a differential H-bridge driver 408, a positive-portion 410+ of an H-bridge 410 (e.g., with FETs M1-M2 previously discussed), and a negative-portion 410− of the H-bridge 410 (e.g., with FETs M3-M4 previously discussed). A load (e.g., speaker, motor, battery, etc., which may include an associated low pass filter) is coupled between a positive output outp and negative output outn of the H-bridge 410.

The first signal subtractor 402+ includes a first (positive) input configured to receive a positive component of an input differential signal (e.g., voltage) Vin+, and a second (negative) input coupled to the positive output outp of the H-bridge 410+. The second signal subtractor 402− includes a first (positive) input configured to receive a negative component of the input differential signal Vin−, and a second (negative) input coupled to the negative output outn of the H-bridge 410−. The outputs of the first and second signal subtractors 402+ and 402− are coupled to positive and negative inputs of the differential loop filter 404. As previously discussed, the loop filter 404 is configured to improve the linearity of the output signal Vout due to non-linearity characteristics of the pulse width modulator 406, H-bridge driver 408, and H-bridge 410+/−.

The pulse width modulator 406 is configured to generate a differential PWM signal (e.g., voltage) pwm_p_lv and pwm_n_lv. The pulse width modulator 406 includes a differential output, at which the PWM signal pwm_p_lv/pwm_n_lv is generated, coupled to a differential input of the H-bridge driver 408. The H-bridge driver 408 is configured to process the PWM signal pwm_p_lv/pwm_n_lv to generate the control signals $V_{g1}$-$V_{g2}$ and $V_{g3}$-$V_{g4}$ for the FETs M1-M2 and M3-M4 of the positive- and negative-portions 410+ and 410− of the H-bridge 410, respectively. The phase adjustments performed by the H-bridge driver 408 adds the BBM or deadtime operation of the H-bridge 410, as discussed further herein. The H-bridge 410 generates the output signal Vout across the load or across the positive and negative outputs outp and outn. The operation of the class-D amplifier 400 is discussed below with reference to FIGS. 4B-4C.

Figure 4B:
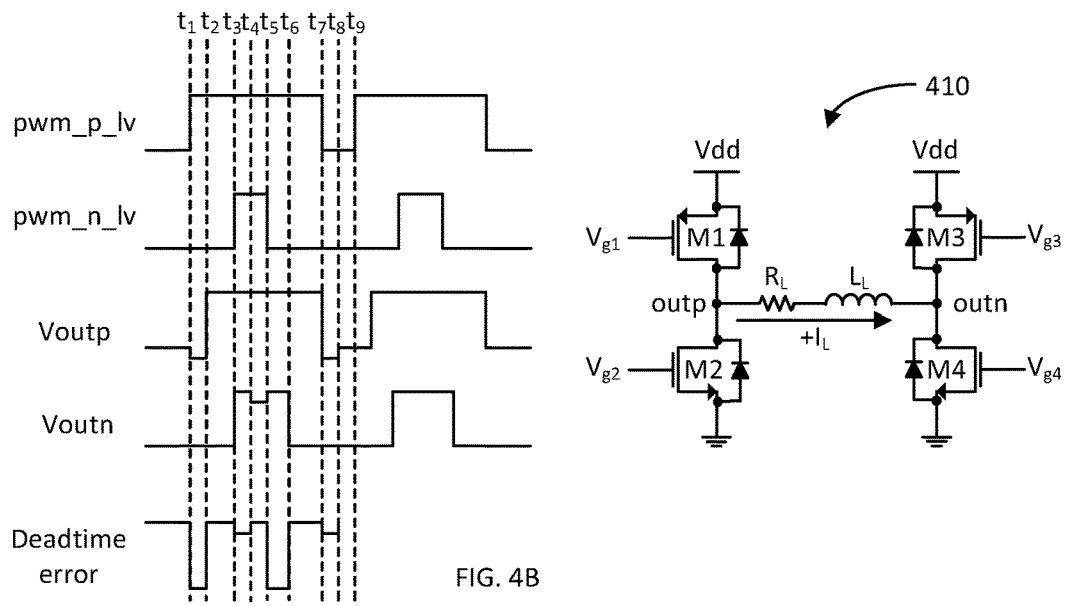
FIG. 4B illustrates a timing diagram of an example operation of the class-D amplifier of FIG. 4A when generating a positive load current in accordance with another aspect of the disclosure.

FIG. 4B illustrates a diagram of an example operation of the class-D amplifier 400 when generating a positive load current +$I_L$ (flowing from outp to outn) in accordance with another aspect of the disclosure. The right-side of the diagram is an example of the H-bridge 410 including the FETs M1-M4 and a load represented by a load pass filter including load resistor $R_L$ and load inductor $L_L$ coupled in series between the positive and negative outputs outp and outn of the H-bridge 410. The FETs M1-M4 are also shown with their body or bulk diodes, as these conduct during deadtimes as discussed below in more detail. The left-side of the diagram illustrates, from top-to-bottom, the states or amplitudes of the signals pwm_p_lv, pwm_n_lv, Voutp (signal at outp), Voutn (signal at outn), and the deadtime error, where the x- or horizontal axis represents time.

In accordance with this example, the pulse width modulator 406, during a PWM driving cycle dictated by a period of a carrier clock signal (CLK) driving the pulse width modulator (not shown in FIG. 4A), produces a positive transition in the PWM signal pwm_p_lv at time $t_1$ before it produces a positive transition in the PWM signal pwm_n_lv at time $t_3$. In response to the positive transition of the PWM signal pwm_p_lv at time $t_1$, the H-bridge driver 408 generates control signals $V_{g1}$-$V_{g4}$ to produce a positive transition in the output signal Voutp, e.g., by turning on FET M1 (while FET M4 is turned on, and FETs M2 and M3 are turned off) at time $t_2$.

During the interval $t_1$-$t_2$, FETs M1 and M2 are turned off as it is a deadtime interval to prevent shoot-through current via FETs M1 and M2 of the H-bridge 410. Due to the inductive load, the positive load current +$I_L$ continues to flow during the deadtime $t_1$-$t_2$, flowing from ground via the bulk diode of FET M2 and through the load. As illustrated, during the deadtime $t_1$-$t_2$, the signal Voutp is a diode-voltage below ground (e.g., −0.6V) due to the voltage drop across the bulk diode of FET M2.

Then, after the positive transition of the output signal Voutp at time $t_2$, and before the positive transition of the pwm_n_lv signal at time $t_3$, the output signal Voutp is at substantially Vdd potential and the output signal Voutn is at substantially ground potential. Thus, during the interval $t_2$-$t_3$, the H-bridge 410 produces an increasing positive load current +$I_L$ through the load resistor $R_L$ and inductor $L_L$. In response to the positive transition of the pwm_n_lv signal at time $t_3$, the H-bridge driver 408 turns off FET M4 at substantially time $t_3$.

At time $t_4$, the H-bridge driver 408 turns on FET M3. During the interval $t_3$-$t_4$, FETs M3 and M4 are turned off, as it is another deadtime interval to prevent shoot-through current via FETs M3 and M4 of the H-bridge 410. Due to the inductive load, the positive load current +$I_L$ continues to flow during the deadtime $t_3$-$t_4$, flowing through the load and towards the upper voltage rail Vdd via the bulk diode of FET M3. As illustrated, during the deadtime $t_3$-$t_4$, the signal Voutn is a diode-voltage above Vdd (e.g., Vdd+0.6V) due to the voltage drop across the bulk diode of FET M3. At time $t_4$, the signal Voutn decreases to Vdd due to the turned-on FET M3.

At time $t_5$, the H-bridge driver 408 turns off FET M3 in response to the negative transition of the pwm_n_lv signal at substantially time $t_5$, and turns on FET M4 at time $t_6$. Again, during the interval $t_5$-$t_6$, FETs M3 and M4 are turned off as it is another deadtime interval to prevent shoot-through current via FETs M3 and M4 of the H-bridge 410. Due to the inductive load, the positive load current +$I_L$ continues to flow during the deadtime $t_5$-$t_6$, flowing through the load and towards the upper voltage rail Vdd via the bulk diode of FET M3. As illustrated, during the deadtime $t_5$-$t_6$, the signal Voutn is a diode-voltage above Vdd (e.g., Vdd+0.6V) due to the voltage drop across the bulk diode of FET M3. At time $t_6$, the signal Voutn drops to ground due to the turned-on FET M4.

Then, at time $t_7$, the H-bridge driver 408 turns off FET M1 in response to the negative transition of the pwm_p_lv signal at substantially time $t_7$, and turns on FET M2 at time $t_8$. During the interval $t_7$-$t_8$, FETs M1 and M2 are turned off as it is another deadtime interval to prevent shoot-through current via FETs M1 and M2 of the H-bridge 410. Due to the inductive load, the positive load current +$I_L$ continues to flow during the deadtime $t_7$-$t_8$, flowing from ground via the bulk diode of FET M2 and through the load. As illustrated, during the deadtime $t_7$-$t_8$, the signal Voutp is a diode-voltage below ground (e.g., −0.6V) due to the voltage drop across the bulk diode of FET M2. At time $t_9$, the pwm_p_lv signal has another positive transition to commence another, for example, positive load current +$I_L$ regulating cycle.

The deadtime error may be determined in accordance with the following equation:

$$\text{Deadtime error} = (Voutp_{actual} - Voutn_{actual}) - (Voutp_{ideal} - Voutn_{ideal})$$

During the first deadtime interval $t_1$-$t_2$, the $Voutp_{actual}$-$Voutn_{actual}$ is −0.6V and $Voutp_{ideal}$-$Voutn_{ideal}$ is Vdd. Thus, the deadtime error during the first deadtime interval $t_1$-$t_2$ is −Vdd−0.6V. During the second deadtime interval $t_3$-$t_4$, the $Voutp_{actual}$-$Voutn_{actual}$ is −0.6V and $Voutp_{ideal}$-$Voutn_{ideal}$ is 0V. Thus, the deadtime error during the second deadtime interval $t_3$-$t_4$ is −0.6V. During the third deadtime interval $t_5$-$t_6$, the $Voutp_{actual}$-$Voutn_{actual}$ is −0.6V and $Voutp_{ideal}$-$Voutn_{ideal}$ is Vdd. Thus, the deadtime error during the third deadtime interval $t_5$-$t_6$ is −Vdd−0.6V. During the fourth deadtime interval $t_7$-$t_8$, the $Voutp_{actual}$-$Voutn_{actual}$ is −0.6V and $Voutp_{ideal}$-$Voutn_{ideal}$ is 0V. Thus, the deadtime error during the second deadtime interval $t_7$-$t_8$ is −0.6V.

Figure 4C:
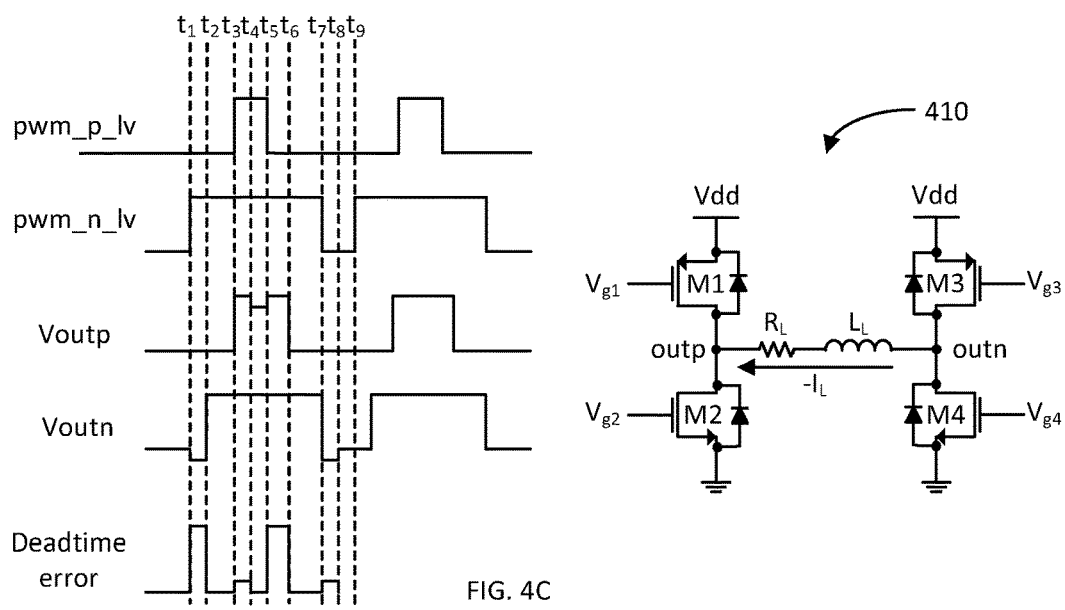
FIG. 4C illustrates a timing diagram of an example operation of the class-D amplifier of FIG. 4A when generating a negative load current in accordance with another aspect of the disclosure.

FIG. 4C illustrates a diagram of an example operation of the class-D amplifier 400 when generating a negative load current −$I_L$ (flowing from outn to outp) in accordance with another aspect of the disclosure. Similarly, the right-side of the diagram is an example of the H-bridge 410 including the FETs M1-M4 and the load represented by the series load resistor $R_L$ and inductor $L_L$ between the positive and negative outputs outp and outn of the H-bridge 410. The FETs M1-M4 are also shown with their body or bulk diodes, as these conduct during deadtimes as discussed below in more detail. Similarly, the left-side of the diagram illustrates, from top-to-bottom, the states or amplitudes of the signals pwm_p_lv, pwm_n_lv, Voutp, Voutn, and the deadtime error, where the x- or horizontal axis represents time.

In accordance with this example, the pulse width modulator 406, during a PWM driving cycle dictated by a period of a carrier clock signal (CLK) driving the pulse width modulator (not shown in FIG. 4A), produces a positive transition in the PWM signal pwm_n_lv at time $t_1$ before it produces a positive transition in the PWM signal pwm_p_lv at time $t_3$. In response to the positive transition of the PWM signal pwm_n_lv at time $t_1$, the H-bridge driver 408 generates control signals $V_{g1}$-$V_{g4}$ to produce a positive transition in the output signal Voutn, e.g., by turning on FET M3 (while FET M2 is turned on, and FETs M1 and M2 are turned off) at time $t_2$.

During the interval $t_1$-$t_2$, FETs M3 and M4 are turned off as it is a deadtime interval to prevent shoot-through current via FETs M3 and M4 of the H-bridge 410. Due to the inductive load, the negative load current −$I_L$ continues to flow during the deadtime $t_1$-$t_2$, flowing from ground via the bulk diode of FET M4 and through the load. As illustrated, during the deadtime $t_1$-$t_2$, the signal Voutn is a diode-voltage below ground (e.g., −0.6V) due to the voltage drop across the bulk diode of FET M4.

Then, after the positive transition of the output signal Voutn at time $t_2$, and before the positive transition of the pwm_n_lv signal at time $t_3$, the output signal Voutn is at substantially Vdd potential and the output signal Voutp is at substantially ground potential. Thus, during the interval $t_2$-$t_3$, the H-bridge 410 produces an increasing negative load current −$I_L$ through the load resistor $R_L$ and inductor $L_L$. In response to the positive transition of the pwm_p_lv signal at time $t_3$, the H-bridge driver 408 turns off FET M2 at substantially time $t_3$.

At time $t_4$, the H-bridge driver 408 turns on FET M1. During the interval $t_3$-$t_4$, FETs M1 and M2 are turned off as it is another deadtime interval to prevent shoot-through current via FETs M1 and M2 of the H-bridge 410. Due to the inductive load, the negative load current −$I_L$ continues to flow during the deadtime $t_3$-$t_4$, flowing through the load and towards the upper voltage rail Vdd via the bulk diode of FET M1. As illustrated, during the deadtime $t_3$-$t_4$, the signal Voutp is a diode-voltage above Vdd (e.g., Vdd+0.6V) due to the voltage drop across the bulk diode of FET M1. At time $t_4$, the signal Voutp decreases to Vdd due to the turned-on FET M1.

At time $t_5$, the H-bridge driver 408 turns off FET M1 in response to the negative transition of the pwm_p_lv signal at substantially time $t_5$, and turns on FET M2 at time $t_6$. Again, during the interval $t_5$-$t_6$, FETs M1 and M2 are turned off as it is another deadtime interval to prevent shoot-through current via FETs M1 and M2 of the H-bridge 410. Due to the inductive load, the negative load current −$I_L$ continues to flow during the deadtime $t_5$-$t_6$, flowing through the load and towards the upper voltage rail Vdd via the bulk diode of FET M1. As illustrated, during the deadtime $t_5$-$t_6$, the signal Voutp is a diode-voltage above Vdd (e.g., Vdd+0.6V) due to the voltage drop across the bulk diode of FET M1. At time $t_6$, the signal Voutp drops to ground due to the turned-on FET M2.

Then, at time $t_7$, the H-bridge driver 408 turns off FET M3 in response to the negative transition of the pwm_n_lv signal at substantially time $t_7$, and turns on FET M4 at time $t_8$. During the interval $t_7$-$t_8$, FETs M3 and M4 are turned off as it is another deadtime interval to prevent shoot-through current via FETs M3 and M4 of the H-bridge 410. Due to the inductive load, the negative load current $-I_L$ continues to flow during the deadtime $t_7$-$t_8$, flowing from ground via the bulk diode of FET M4 and through the load. As illustrated, during the deadtime $t_7$-$t_8$, the signal Voutn is a diode-voltage below ground (e.g., $-0.6V$) due to the voltage drop across the bulk diode of FET M4. At time $t_9$, the pwm_n_lv signal has another positive transition to commence another, for example, negative load current $-I_L$ regulating cycle.

The deadtime error may be determined in accordance with the following equation:

$$\text{Deadtime error} = (Voutp_{actual} - Voutn_{actual}) - (Voutp_{ideal} - Voutn_{ideal})$$

During the first deadtime interval $t_1$-$t_2$, the $Voutp_{actual}$-$Voutn_{actual}$ is $+0.6V$ and $Voutp_{ideal}$-$Voutn_{ideal}$ is $-Vdd$. Thus, the deadtime error during the first deadtime interval $t_1$-$t_2$ is $Vdd+0.6V$. During the second deadtime interval $t_3$-$t_4$, the $Voutp_{actual}$-$Voutn_{actual}$ is $+0.6V$ and $Voutp_{ideal}$-$Voutn_{ideal}$ is $0V$. Thus, the deadtime error during the second deadtime interval $t_3$-$t_4$ is $+0.6V$. During the third deadtime interval $t_5$-$t_6$, the $Voutp_{actual}$-$Voutn_{actual}$ is $+0.6V$ and $Voutp_{ideal}$-$Voutn_{ideal}$ is $-Vdd$. Thus, the deadtime error during the third deadtime interval $t_5$-$t_6$ is $Vdd+0.6V$. During the fourth deadtime interval $t_7$-$t_8$, the $Voutp_{actual}$-$Voutn_{actual}$ is $+0.6V$ and $Voutp_{ideal}$-$Voutn_{ideal}$ is $0V$. Thus, the deadtime error during the second deadtime interval $t_7$-$t_8$ is $+0.6V$.

Figure 5A:
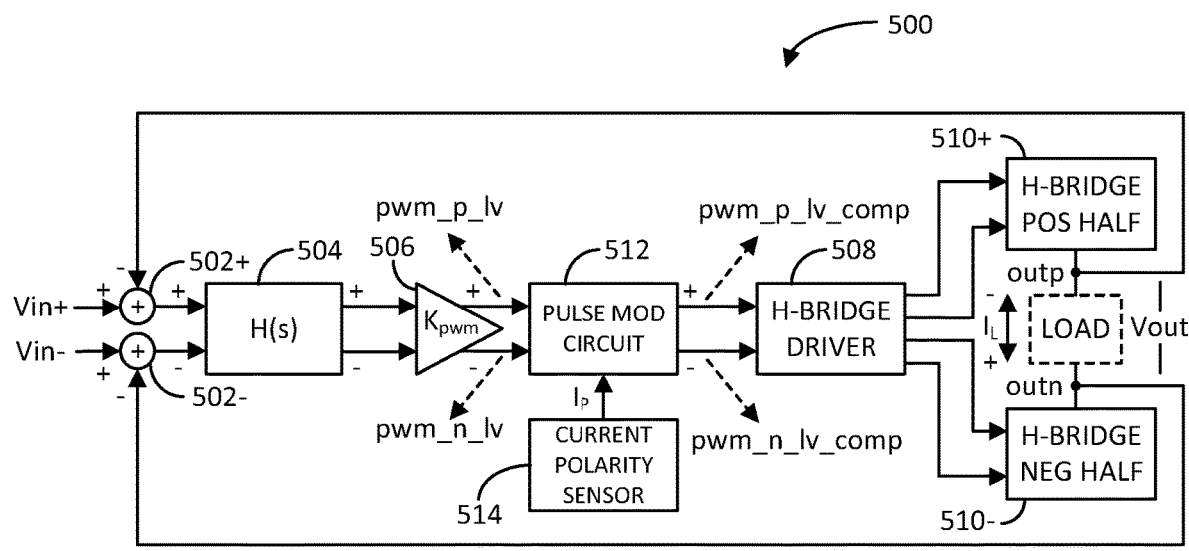
FIG. 5A illustrates a block/schematic diagram of another example class-D amplifier in accordance with another aspect of the disclosure.

FIG. 5A illustrates a block/schematic diagram of another example class-D amplifier 500 in accordance with another aspect of the disclosure. In the previously discussed class-D amplifier 400, the deadtimes $t_1$-$t_2$ and $t_5$-$t_6$ reduce the load current. To compensate for the reduction or error in the load current, the class-D amplifier 500 modifies the PWM signals pwm_p_lv and pwm_n_lv generated by a pulse width modulator to increase the load current during each clock period in order to compensate for the reduction in the load currents during the deadtimes $t_1$-$t_2$ and $t_5$-$t_6$.

More specifically, the class-D amplifier 500 includes first and second signal subtractors 502+ and 502− (e.g., differential voltage subtractor), a differential loop filter H(s) 504, a differential PWM 506, a differential pulse modification circuit 512 including an associated current polarity sensor 514, a differential H-bridge driver 508, a positive-portion 510+ of an H-bridge 510 (e.g., with FETs M1-M2 previously discussed), and a negative-portion 510− of the H-bridge 510 (e.g., with FETs M3-M4 previously discussed). A load (e.g., speaker, motor, battery, etc., which may include an associated low pass filter) is coupled between a positive output outp and negative output outn of the H-bridge 510.

The first signal subtractor 502+ includes a first (positive) input configured to receive a positive component of an input differential signal Vin+, and a second (negative) input coupled to the positive output outp of the H-bridge 510. The second signal subtractor 502− includes a first (positive) input configured to receive a negative component of the input differential signal Vin−, and a second (negative) input coupled to the negative output outn of the H-bridge 510. The outputs of the first and second signal subtractors 502+ and 502− are coupled to positive and negative inputs of the differential loop filter 504. As previously discussed, the loop filter 504 is configured to improve the linearity of the output signal Vout due to non-linearity characteristics of the pulse width modulator 506, the H-bridge driver 508, and the H-bridge 510+/−.

The pulse width modulator 506 is configured to generate a differential PWM signal pwm_p_lv and pwm_n_lv. The pulse width modulator 506 includes a differential output, at which the PWM signal pwm_p_lv/pwm_n_lv is generated, coupled to a differential input of the pulse modification circuit 512. The pulse modification circuit 512 is configured to modify the PWM signals pwm_p_lv and pwm_n_lv to generate modified PWM signals pwm_p_lv_comp and pwm_n_lv_comp based on the polarity or direction (e.g., positive or negative) of the load current $I_L$ as indicated by a current polarity signal $I_P$ generated by the current polarity sensor 514.

Accordingly, the current polarity sensor 514 is configured to sense the polarity of the load current $I_L$, and provide a signal $I_P$ indicating the polarity to the pulse modification circuit 512. The current polarity sensor 514 may be configured to sense the polarity of the load current $I_L$ based on the PWM signals pwm_p_lv and pwm_n_lv (e.g., during a PWM cycle, if pwm_p_lv has a positive transition before the pwm_n_lv has one, then the current polarity sensor 514 senses a positive load current $+I_L$; and if pwm_n_lv has a positive transition before the pwm_p_lv has one, then the current polarity sensor 514 senses a negative load current $-I_L$). It shall be understood that the current polarity sensor 514 may sense the polarity of the load current in other manners. The pulse modification circuit 512 includes a differential output coupled to a differential input of the H-bridge driver 508. The pulse modification circuit including the associated current polarity sensor 514 operate as a deadtime compensation circuit as described further herein.

The H-bridge driver 508 is configured to process the modified pwm signals pwm_p_lv_comp and pwm_n_lv_comp to generate the control signals $V_{g1}$-$V_{g2}$ and $V_{g3}$-$V_{g4}$ for the FETs M1-M2 and M3-M4 of the positive- and negative-portions 510+ and 510− of the H-bridge 510, respectively. The phase adjustments performed by the H-bridge driver 508 adds the BBM or deadtime operation of the H-bridge 510, as discussed further herein. The H-bridge 510 generates the output signal Vout across the load or across the positive and negative outputs outp and outn. The operation of the class-D amplifier 500 is discussed below with reference to FIGS. 5B-5C.

Figure 5B:
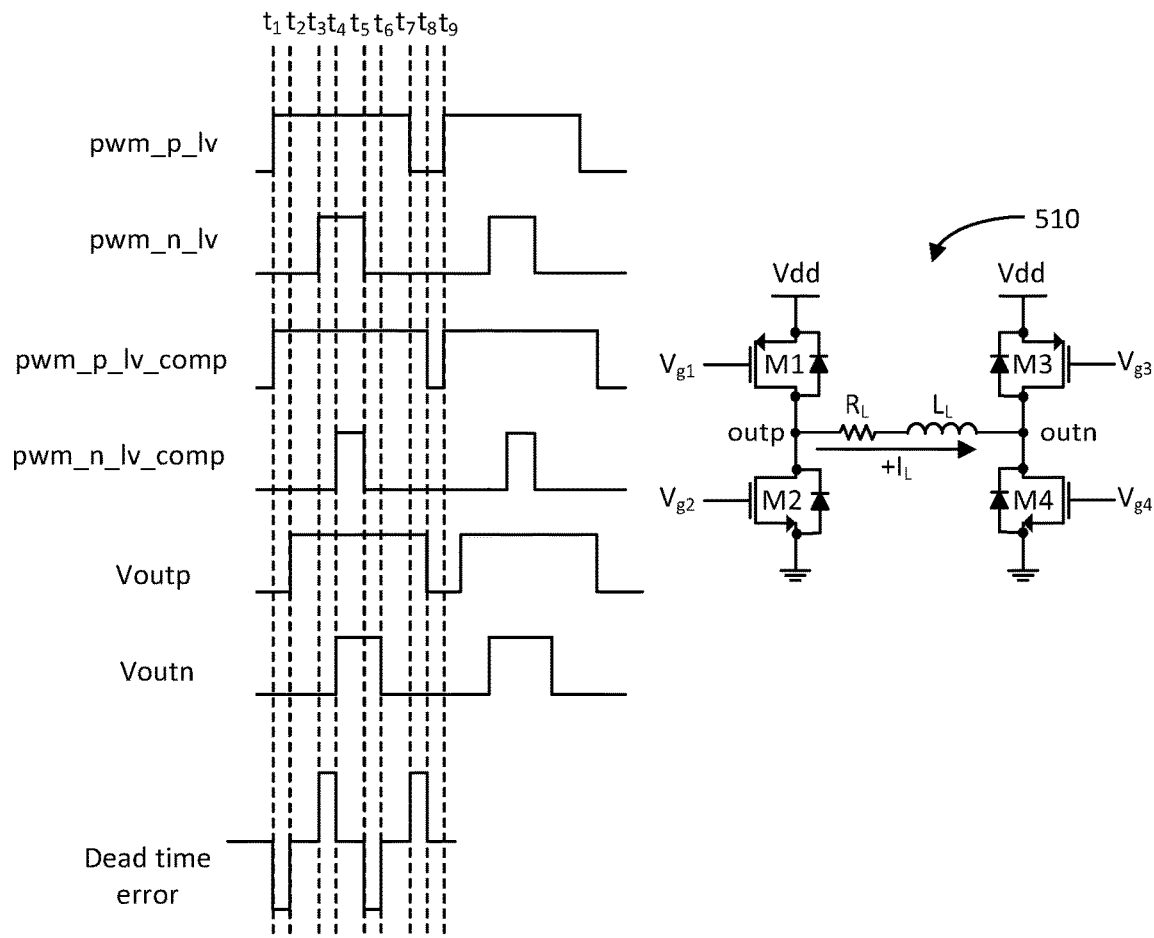
FIG. 5B illustrates a timing diagram of an example operation of the class-D amplifier of FIG. 5A when generating a positive load current in accordance with another aspect of the disclosure.

FIG. 5B illustrates a diagram of an example operation of the class-D amplifier 500 when generating a positive load current $+I_L$ (flowing from outp to outn) in accordance with another aspect of the disclosure. The right-side of the diagram is an example of the H-bridge 510 including the FETs M1-M4 and a load represented by a load pass filter including load resistor $R_L$ and load inductor $L_L$ coupled in series between the positive and negative outputs outp and outn of the H-bridge 510. The left-side of the diagram illustrates, from top-to-bottom, the states or amplitudes of the signals pwm_p_lv, pwm_n_lv, pwm_p_lv_comp, pwm_n_lv_comp, Voutp (signal at outp), Voutn (signal at outn), and the deadtime error, where the x- or horizontal axis represents time.

More particularly, if the current polarity sensor 514 detects a positive load current $+I_L$ to be generated during a current PWM cycle, the pulse modification circuit 512 generates the modified pwm signal pwm_p_lv_comp such that its negative transition is delayed compared to the negative transition of the PWM signal pwm_p_lv (e.g., by an amount substantially equal to deadtime interval), while maintaining the positive transitions of the signals pwm_p_lv and pwm_p_lv_comp substantially coincidental. Additionally, the pulse modification circuit 512 generates the modified pwm signal pwm_n_lv_comp such that its positive transition is delayed compared to the positive transition of the PWM signal pwm_n_lv (e.g., by an amount substantially equal to a deadtime interval), while maintaining the negative transitions of the signals pwm_p_lv and pwm_p_lv_comp substantially coincidental. As a result of the aforementioned pulse modifications, the positive load current $+I_L$ is increased to compensate for reduction in the load current due to the deadtimes. For ease of explanation, the effects of the bulk diodes of the FETs M1-M4 are removed in FIG. 5B.

More specifically, the pulse width modulator 506, during a PWM cycle dictated by a period of a carrier clock signal (CLK) driving the pulse width modulator (not shown in FIG. 5A), produces a positive transition in the PWM signal pwm_p_lv at time $t_1$ before it produces a positive transition in the PWM signal pwm_n_lv at time $t_3$. Since a positive transition in the pwm_p_lv signal occurs first (before the positive transition occurs in the pwm_n_lv signal), the current polarity sensor 514 detects a positive load current $+I_L$ to be generated, and sets the current polarity signal $I_P$ accordingly. In response to the positive transition in the PWM signal pwm_p_lv, the pulse modification circuit 512 generates a positive transition in the modified pwm signal pwm_p_lv_comp at substantially time $t_1$. Further, in response to the positive transition in the modified pwm signal pwm_p_lv_comp at time $t_1$, the H-bridge driver 508 generates the control signals $V_{g1}$-$V_{g4}$ to produce a positive transition in the output signal Voutp at time $t_2$. During time interval $t_1$-$t_2$, the output signals Voutp and Voutn are both substantially at ground potential. The interval $t_1$-$t_2$ is a deadtime interval to prevent shoot-through current in the H-bridge 510, as previously discussed.

In response to the positive transition in the PWM signal pwm_n_lv at time $t_3$, the pulse modification circuit 512 generates a positive transition in the modified pwm signal pwm_n_lv_comp at time $t_4$. In response to the positive transition in the modified pwm signal pwm_n_lv_comp, the H-bridge driver 508 generates the control signals $V_{g1}$-$V_{g4}$ to produce a positive transition in the output signal Voutn at substantially time $t_4$. Thus, during time interval $t_2$-$t_4$, the output signal Voutp is at substantially Vdd potential and the output signal Voutn is at ground potential. Thus, during the interval $t_2$-$t_4$, the H-bridge 510 produces an increasing positive load current $+I_L$ through the load resistor $R_L$ and inductor $L_L$. Compared to the class-D amplifier 400, the increasing positive load current $+I_L$ is generated during time interval $t_2$-$t_3$, whereas the increasing positive load current $+I_L$ in class-D amplifier 500 is generated during time interval $t_2$-$t_4$. If the difference between $t_4$-$t_2$ and $t_3$-$t_2$ is substantially the same as the deadtime interval $t_1$-$t_2$, then the positive load current $+I_L$ has been compensated for the deadtime.

In response to a negative transition of the PWM signal pwm_n_lv at time $t_5$, the pulse modification circuit 512 generates a negative transition in the modified pwm signal pwm_n_lv_comp at substantially time $t_5$. In response to the negative transition in the modified pwm signal pwm_n_lv_comp, the H-bridge driver 508 generates the control signals $V_{g1}$-$V_{g4}$ to produce a negative transition in the output signal Voutn at time $t_6$. During time interval $t_4$-$t_5$, the output signals Voutp and Voutn are both substantially at Vdd potential. Then, during time interval $t_5$-$t_6$, another deadtime interval is introduced to prevent shoot-through current in the H-bridge 510. After the negative transition of the output signal Voutn at time $t_6$, and before a negative transition of the pwm_p_lv signal at time $t_7$, the output signal Voutp is at substantially Vdd potential and the output signal Voutn is at substantially ground potential. Thus, during the interval $t_6$-$t_7$, the H-bridge 510 produces an increasing positive load current $+I_L$ through the load resistor $R_L$ and inductor $L_L$.

In response to the negative transition of the pwm_p_lv signal at time $t_7$, the pulse modification circuit 512 generates a negative transition in the modified pwm signal pwm_p_lv_comp at time $t_8$. In response to the negative transition in the modified pwm signal pwm_p_lv_comp, the H-bridge driver 508 generates the control signals $V_{g1}$-$V_{g4}$ to produce a negative transition in the output signal Voutp at substantially time $t_8$. After time $t_8$, both output signals Voutp and Voutn are substantially at ground potential. Compared to the class-D amplifier 400, the generation of the positive load current $+I_L$ is extended from a time interval $t_5$-$t_7$ to a time interval $t_6$-$t_9$. If the difference between $t_6$-$t_9$ and $t_5$-$t_7$ is substantially the same as the deadtime interval $t_5$-$t_6$, then the positive load current $+I_L$ has been compensated for the deadtime.

Figure 5C:
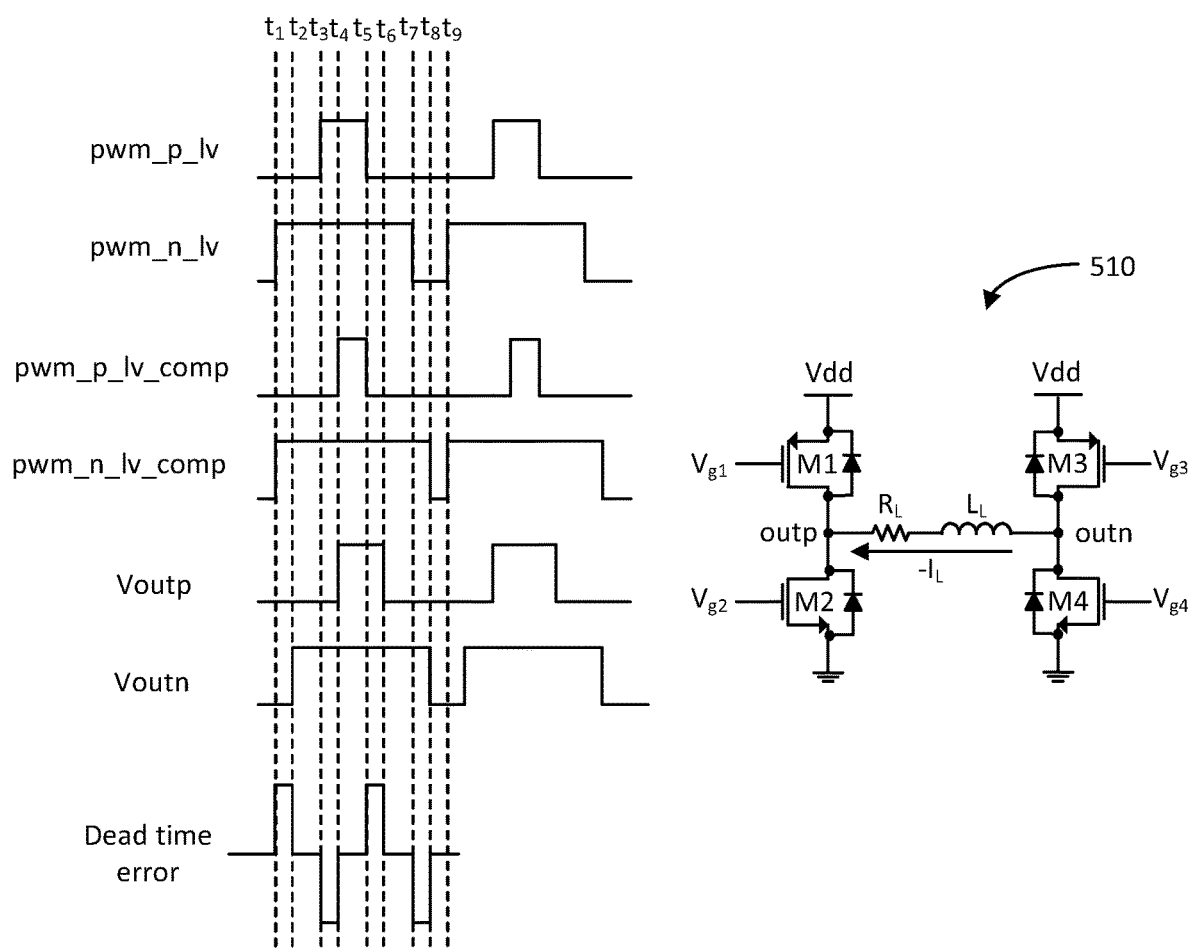
FIG. 5C illustrates a timing diagram of an example operation of the class-D amplifier of FIG. 5A when generating a negative load current in accordance with another aspect of the disclosure.

FIG. 5C illustrates a diagram of an example operation of the class-D amplifier 500 when generating a negative load current $-I_L$ (flowing from outn to outp) in accordance with another aspect of the disclosure. The right-side of the diagram is an example of the H-bridge 510 including the FETs M1-M4 and a load represented by a load pass filter including load resistor $R_L$ and load inductor $L_L$ coupled in series between the positive and negative outputs outp and outn of the H-bridge 510. The left-side of the diagram illustrates, from top-to-bottom, the states or amplitudes of the signals pwm_p_lv, pwm_n_lv, pwm_p_lv_comp, pwm_n_lv_comp, Voutp, Voutn, and the deadtime error, where the x- or horizontal axis represents time.

Similarly, if the current polarity sensor 514 detects a negative load current $-I_L$ to be generated during a current PWM cycle, the pulse modification circuit 512 generates the modified pwm signal pwm_n_lv_comp such that its negative transition is delayed compared to the negative transition of the PWM signal pwm_n_lv (e.g., by an amount substantially equal to a deadtime interval), while maintaining the positive transitions of the signals pwm_n_lv and pwm_n_lv_ comp substantially coincidental. Additionally, the pulse modification circuit 512 generates the modified pwm signal pwm_p_lv_comp such that its positive transition is delayed compared to the positive transition of the PWM signal pwm_p_lv (e.g., by an amount substantially equal to deadtime interval), while maintaining the negative transitions of the signals pwm_p_lv and pwm_p_lv_comp substantially coincidental. As a result of the aforementioned pulse modifications, the negative load current $-I_L$ is increased to compensate for reduction in the load current by the deadtimes. For ease of explanation, the effects of the bulk diodes of the FETs M1-M4 are removed in FIG. 5C.

More specifically, the pulse width modulator 506, during a PWM cycle dictated by a period of a carrier clock signal (CLK) driving the pulse width modulator (not shown in FIG. 5A), produces a positive transition in the PWM signal pwm_n_lv at time $t_1$ before it produces a positive transition in the PWM signal pwm_p_lv at time $t_3$. Since a positive transition in the pwm_n_lv signal occurs first (before the positive transition occurs in the pwm_p_lv signal), the current polarity sensor 514 detects a negative load current $-I_L$ to be generated, and sets the current polarity signal $I_P$ accordingly. In response to the positive transition in the PWM signal pwm_n_lv, the pulse modification circuit 512 generates a positive transition in the modified pwm signal pwm_n_lv_comp substantially at time $t_1$. Further, in response to the positive transition in the modified pwm signal pwm_n_lv_comp at time $t_1$, the H-bridge driver 508 generates the control signals $V_{g1}$-$V_{g4}$ to produce a positive transition in the output signal Voutn at time $t_2$. During time interval $t_1$-$t_2$, the output signals Voutp and Voutn are both at substantially ground potential. Thus, the interval $t_1$-$t_2$ is a deadtime interval to prevent shoot-through current in the H-bridge 510, as previously discussed.

In response to the positive transition in the PWM signal pwm_p_lv at time $t_3$, the pulse modification circuit 512 generates a positive transition in the modified pwm signal pwm_p_lv_comp at time $t_4$. In response to the positive transition in the modified pwm signal pwm_p_lv_comp, the H-bridge driver 508 generates the control signals $V_{g1}$-$V_{g4}$ to produce a positive transition in the output signal Voutp at substantially time $t_4$. Thus, during time interval $t_2$-$t_4$, the output signal Voutn is at substantially Vdd potential and the output signal Voutp is at ground potential. Thus, during the interval $t_2$-$t_4$, the H-bridge 510 produces an increasing negative load current $-I_L$ through the load resistor $R_L$ and inductor $L_L$. Compared to class-D amplifier 400, the increasing negative load current $-I_L$ is generated during time interval $t_2$-$t_3$, whereas the increasing negative load current $-I_L$ is generated during time interval $t_2$-$t_4$. If the difference between $t_4$-$t_2$ and $t_3$-$t_2$ is substantially the same as the deadtime interval $t_1$-$t_2$, then the negative load current $-I_L$ has been compensated for the deadtime.

In response to a negative transition of the PWM signal pwm_p_lv at time $t_5$, the pulse modification circuit 512 generates a negative transition in the modified pwm signal pwm_p_lv_comp at substantially time $t_5$. In response to the negative transition in the modified pwm signal pwm_p_lv_comp, the H-bridge driver 508 generates the control signals $V_{g1}$-$V_{g4}$ to produce a negative transition in the output signal Voutp at time $t_6$. During time interval $t_4$-$t_5$, the output signals Voutp and Voutn are both at substantially Vdd potential. Then, during time interval $t_5$-$t_6$, another deadtime interval is introduced to prevent shoot-through current in the H-bridge 510. After the negative transition of the output signal Voutp at time $t_6$, and before a negative transition of the pwm_n_lv signal at time $t_7$, the output signal Voutp is at substantially Vdd potential and the output signal Voutn is substantially at ground potential. Thus, during the interval $t_6$-$t_7$, the H-bridge 510 produces an increasing negative load current $-I_L$ through the load resistor $R_L$ and inductor $L_L$.

In response to the negative transition of the pwm_n_lv signal at time $t_7$, the pulse modification circuit 512 generates a negative transition in the modified pwm signal pwm_n_lv_comp at time $t_8$. In response to the negative transition in the modified pwm signal pwm_n_lv_comp, the H-bridge driver 508 generates the control signals $V_{g1}$-$V_{g4}$ to produce a negative transition in the output signal Voutn at substantially time $t_5$. After time $t_8$, both output signals Voutp and Voutn are substantially at ground potential. Compared to class-D amplifier 400, the generation of the negative load current $-I_L$ is extended from a time interval $t_5$-$t_7$ to a time interval $t_6$-$t_9$. If the difference between $t_6$-$t_9$ and $t_5$-$t_7$ is substantially the same as the deadtime interval $t_5$-$t_6$, then the negative load current $-I_L$ has been compensated for the deadtime.

Figure 6A:
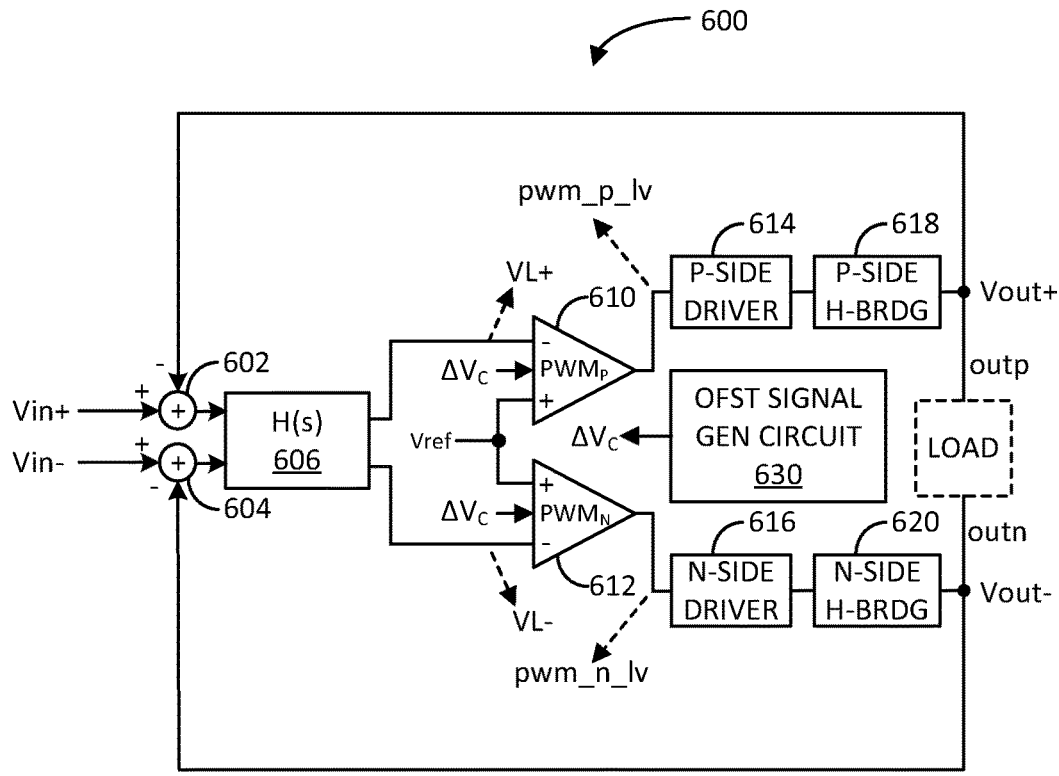
FIG. 6A illustrates a block/schematic diagram of another example class-D amplifier in accordance with another aspect of the disclosure.

FIG. 6A illustrates a block/schematic diagram of another example class-D amplifier 600 in accordance with another aspect of the disclosure. In class-D amplifier 500 previously discussed, the modification of the PWM signals pwm_p_lv and pwm_n_lv occurs at the output of the pulse width modulator 506 by pulse width modulation circuit 512 and associated current polarity sensor 514. In class-D amplifier 600, the modification of the PWM signals pwm_p_lv and pwm_n_lv occurs at the input of a pulse width modulator by adjusting an offset signal (e.g., voltage) applied to the input of the pulse width modulator.

For example, if a positive load current $+I_L$ is detected, the offset signal applied to the input of the positive-side pulse width modulator is configured to delay the negative transition of the PWM signals pwm_p_lv to compensate for the negative error due to a deadtime interval. If a negative load current $-I_L$ is detected, the offset signal applied to the input of the negative-side pulse width modulator is configured to delay the negative transition of the PWM signals pwm_n_lv to compensate for the positive error due to a deadtime interval.

More specifically, the class-D amplifier 600 includes differential subtractors 602 and 604; a differential loop filter $H(s)$ 606; a positive-side pulse width modulator $PWM_P$ 610 and a negative-side $PWM_N$ 612; a positive-side H-bridge driver 614 and a negative-side H-bridge driver 616; a positive-side of an H-bridge 618 (e.g., FETs M1 and M2) and a negative-side of an H-bridge 620 (e.g., FETs M3 and M4); and an offset signal (e.g., voltage) generating circuit 630 serving as a deadtime compensation circuit.

The differential subtractors 602 and 604 include positive differential inputs configured to receive an input differential signal Vin+/Vin−, and negative differential inputs coupled to the outputs outp and outn of the positive-side H-bridge and negative-side H-bridge 618 and 620, respectively. The differential subtractors 602 and 604 include differential outputs coupled to differential inputs of the differential loop filter $H(s)$ 606. The differential loop filter $H(s)$ 606 includes differential outputs coupled to negative inputs of the positive-side pulse width modulator $PWM_P$ 610 and negative-side pulse width modulator $PWM_N$ 612, respectively. The differential loop filter $H(s)$ 606 is configured to generate a loop filtered differential signal (e.g., voltage) VL+/VL− at its differential outputs. A DC reference signal (e.g., voltage) Vref is applied to positive inputs of the positive-side pulse width modulator $PWM_P$ 610 and negative-side pulse width modulator $PWM_N$ 612, respectively. The positive-side and the negative-side pulse width modulators $PWM_P$ 610 and $PWM_N$ 612 include offset signal inputs coupled to an output of the offset signal generating circuit 630, and thus, configured to receive a deadtime compensation offset signal (e.g., voltage) $\Delta V_C$ therefrom.

The positive-side pulse width modulator $PWM_P$ 610 includes an output configured to produce the PWM signal pwm_p_lv; its output being coupled to an input of the positive-side H-bridge driver 614. Similarly, the negative-side pulse width modulator $PWM_N$ 612 includes an output configured to produce the PWM signal pwm_n_lv; its output being coupled to an input of the negative-side H-bridge driver 616. The positive-side H-bridge driver 614 includes an output coupled to an input of the positive-portion of the H-bridge 618 (e.g., gates of FETs M1 and M2). Similarly, the negative-side driver 616 includes an output coupled to an input of the negative-portion of the H-bridge 620 (e.g., gates of FETs M3 and M4).

A load (e.g., speaker, motor, battery, etc.) may be coupled between an output outp of the positive-side H-bridge 618 and an output outn of the negative-side H-bridge 620.

In operation, the differential loop filter $H(s)$ 606 is configured to perform one or more orders of integration of a difference between the differential output signal Vout+/Vout− and the differential input signal Vin+/Vin− to generate the loop filtered differential signal VL+/VL−. The pulse width modulators 610 and 612 are configured to generate the PWM signals pwm_p_lv and pwm_n_lv based on the loop filtered differential signal VL+/VL, the reference signal Vref, and the deadtime compensation offset signal $\Delta V_C$. The positive-side H-bridge driver 614 is configured to drive the FETs M1 and M2 of the positive-side H-bridge 618 based on the pwm_p_lv signal, and the negative-side H-bridge driver 616 is configured to drive the FETs M3 and M4 of the negative-side H-bridge 620 based on the pwm_n_lv signal.

With regard to deadtime compensation when a positive load current $+I_L$ is detected, the deadtime compensation offset signal $\Delta V_C$ is configured to delay the negative transition of the pwm_p_lv to compensate for the deadtime negative error during time intervals $t_5$-$t_6$ (See e.g., FIG. 5B). Similarly, with regard to deadtime compensation when a negative load current $-I_L$ is detected, the deadtime compensation offset signal $\Delta V_C$ is configured to delay the negative transition of the pwm_n_lv to compensate for the deadtime positive error during time intervals $t_5$-$t_6$ (See e.g., FIG. 5C). Thus, in class-D amplifier 600, the deadtime compensation is performed at the input of the pulse width modulator 610/612, whereas in class-D amplifier 500, the deadtime compensation is performed at the output of the pulse width modulator 506.

Figure 6B:
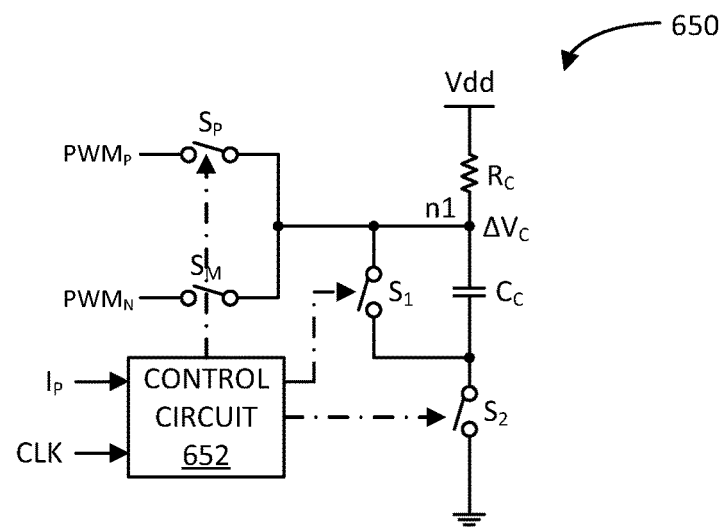
FIG. 6B illustrates a schematic diagram of an example offset signal generating circuit of the class-D amplifier of FIG. 6A in accordance with another aspect of the disclosure.

FIG. 6B illustrates a schematic diagram of an example offset signal (e.g., voltage) generating circuit 650 in accordance with another aspect of the disclosure. The offset signal generating circuit 650 is an example of a more detailed implementation of the offset signal generating circuit 630 previously discussed.

In particular, the offset signal generating circuit 650 includes a resistor $R_C$, a capacitor $C_C$, and a switching device $S_2$ coupled in series between an upper voltage rail Vdd and a lower voltage rail (e.g., ground). The offset signal generating circuit 650 further includes another switching device $S_1$ coupled in parallel with the capacitor $C_C$. Additionally, the offset signal generating circuit 650 includes switching devices $S_P$ and $S_M$ coupled between a node n1 and the offset signal inputs of the pulse width modulators 610 and 612, respectively. The offset signal generating circuit 650 further includes a control circuit 652 including outputs coupled to the switching devices $S_1$, $S_2$, $S_P$ and $S_M$ for controlling their open/closed state. The control circuit 652 may include inputs configured to receive a load current polarity signal $I_P$ and a carrier clock (whose period sets a PWM cycle), respectively.

In operation, between consecutive PWM cycles as indicated by the carrier clock, the control circuit 652 closes the switching device $S_1$ to discharge the capacitor $C_C$. Then, at the beginning of the next PWM cycle and the $I_P$ signal indicating a positive load current $+I_L$ is to be generated, the control circuit 652 closes the switching devices $S_2$ and $S_P$ and opens switching devices $S_1$ and $S_M$. The closed switching device $S_2$ causes the deadtime compensation signal $\Delta V_C$ to be generated at node n1, and the closed switching device $S_P$ provides the deadtime compensation signal $\Delta V_C$ to the offset signal input of the pulse width modulator 610. As discussed, the deadtime compensation offset signal $\Delta V_C$ delays the negative transition in the PWM signal pwm_p_lv to compensate for the negative error during the deadtime $t_5$-$t_6$.

The control circuit 652 then again closes the switching device $S_1$ to discharge the capacitor $C_C$. At the beginning of a following PWM cycle and the $I_P$ signal indicating a negative load current $-I_L$ is to be generated, the control circuit 652 closes the switching devices $S_2$ and $S_M$ and opens switching devices $S_1$ and $S_P$. The closed switching device $S_2$ causes the deadtime compensation signal $\Delta V_C$ to be generated at node n1, and the closed switching device $S_M$ provides the deadtime compensation signal $\Delta V_C$ to the offset signal input of the pulse width modulator 612. As discussed, the deadtime compensation signal $\Delta V_C$ delays the negative transition in the PWM signal pwm_n_lv to compensate for the positive error during the deadtime $t_5$-$t_6$.

Figure 7:
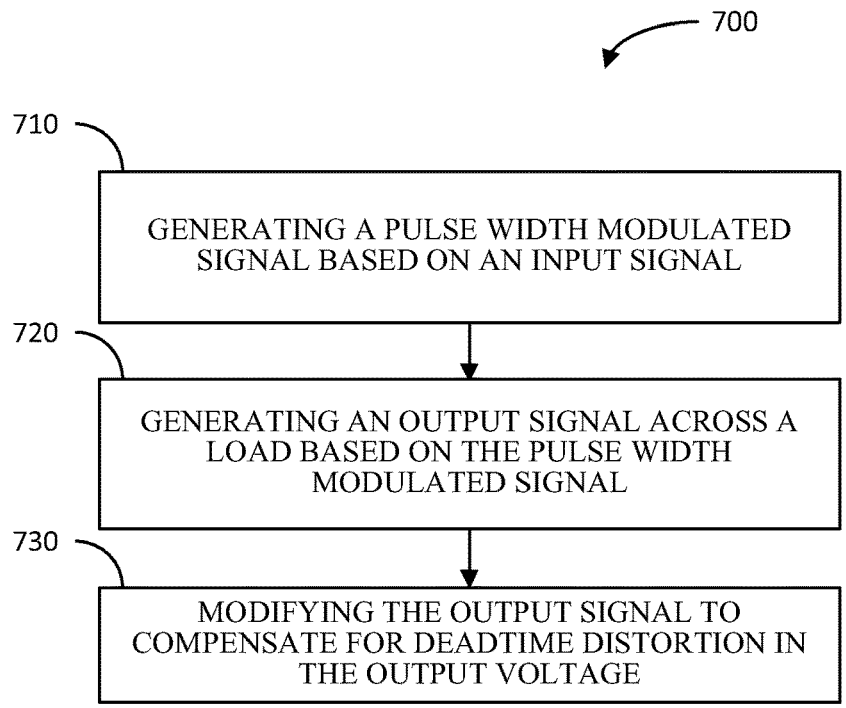
FIG. 7 illustrates a flow diagram of an example method of generating an output signal based on an input signal in accordance with another aspect of the disclosure.

FIG. 7 illustrates a flow diagram of an example method 700 of generating an output signal based on an input signal in accordance with another aspect of the disclosure. The method 700 includes generating a pulse width modulated signal based on an input signal (block 710). Examples of means for generating a pulse width modulated signal based on an input signal include any of the pulse width modulators described herein.

The method 700 further includes generating an output signal across a load based on the pulse width modulated signal (block 720). Examples of means for generating an output signal across a load based on the pulse width modulated signal include any of the H-bridges described herein.

Additionally, the method 700 includes modifying the output signal to compensate for deadtime distortion in the output signal (block 730). Examples of means for modifying the output signal to compensate for deadtime distortion in the output signal include deadtime compensation circuit 220 of class-D amplifier 200 or its more detailed implementation 300, the pulse modification circuit 512 and associated current polarity sensor 514 of class-D amplifier 500, and the offset signal generating circuit 630 of class-D amplifier 600 or its more detailed implementation 650.

The operation of modifying the output signal may include generating a first signal based on a difference between the output signal and the pulse width modulated signal; filtering the first signal to generate a second signal; scaling the second signal to generate a third signal; and generating a fourth signal based on a difference between the third signal and the input signal, wherein the pulse width modulated signal is based on the fourth signal. Examples of means for generating a first signal based on a difference between the output signal and the pulse width modulated signal, means for filtering the first signal to generate a second signal, means for scaling the second signal to generate a third signal, and means for generating a fourth signal based on a difference between the third signal and the input signal include the third signal subtractor 222, the low pass filter 224, the signal scalar 226, and the second signal subtractor 206, respectively. Examples of the first three aforementioned means include the deadtime compensation circuit 250.

The operation of modifying the output signal may include modifying the pulse width modulated signal. Examples of means for modifying the pulse width modulated signal include the pulse modification circuit 512 and associated current polarity sensor 514 of class-D amplifier 500. The operation of modifying the generating of the pulse width modulated signal include the offset signal generating circuit 630 or its more detailed implementation 650.

Figure 8:
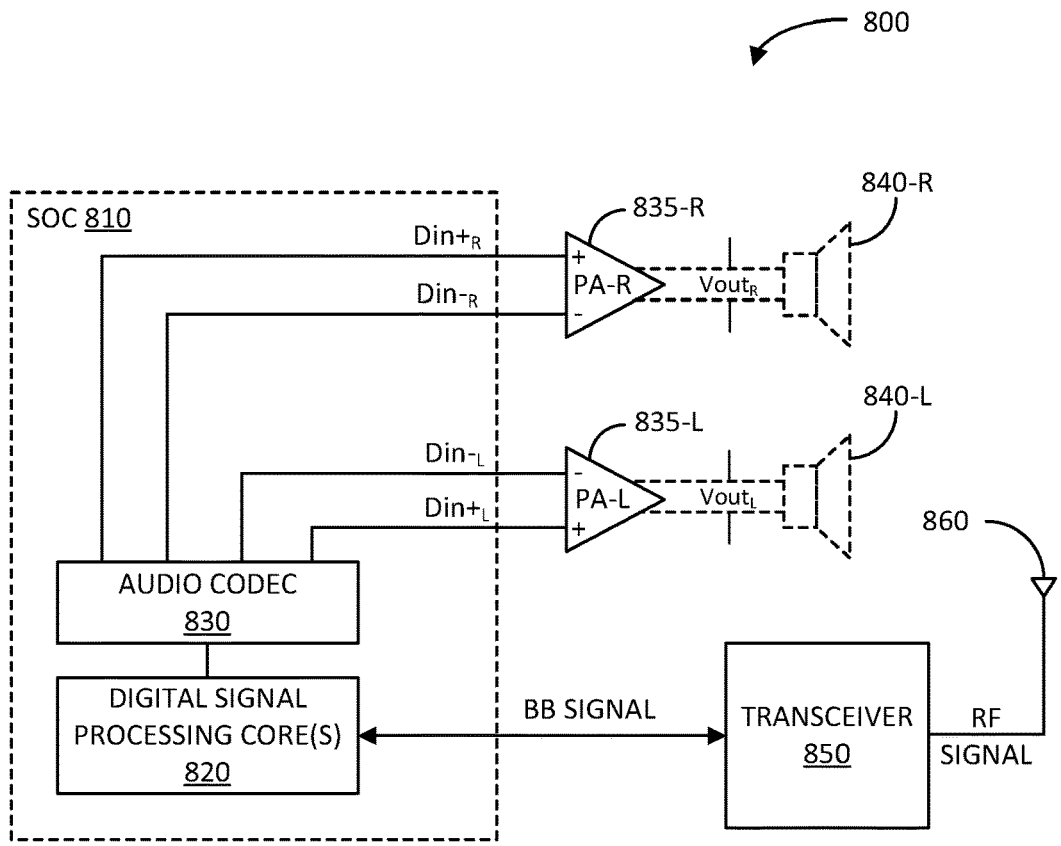
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device 800 includes an integrated circuit (IC) 810, which may be implemented as a system on chip (SOC). The SOC 810 may include one or more digital signal processing cores 820 and an audio codec 830. The audio codec 830 may be configured to generate a pair of stereo audio signals $Din+_R/Din-_R$ and $Din-F_L/Din-_L$. The audio signals $Din+_R/Din-_R$ and $Din+_L/Din-_L$ may pertain to a telephone call voice path, stored music or audio files, text message audio, etc. The one or more digital signal processing cores 820 may provide the raw audio data to the audio codec 830 in order for the audio signals $Din+_R/Din-_R$ and $Din+_L/Din-_L$ to be generated. The one or more digital signal processing cores 820 may also be configured to generate and/or process a baseband (BB) signal.

The wireless communication device 800 further includes stereo class-D amplifiers 835-R and 835-L configured to amplify the pair of stereo audio signals Din+$_R$/Din−$_R$ and Din+$_L$/Din−$_L$ to generate a pair of stereo output audio signals Vout$_R$ and Vout$_L$, respectively. The pair of stereo output audio signals Vout$_R$ and Vout$_L$ are provided to a stereo pair of audio speakers 840-R and 840-L for sound production, respectively.

The wireless communication device 800 further includes a transceiver 850 and at least one antenna 860 (e.g., an antenna array). The transceiver 850 is configured to generate a radio frequency (RF) signal based on the baseband (BB) signal and/or generate the baseband (BB) signal based on an RF signal. The at least one antenna 860 is configured to wirelessly transmit and/or receive an RF signal.

The following provides an overview of aspects of the present disclosure:

Aspect 1: An apparatus, including: a pulse width modulator including an input configured to receive a first signal based on an input signal, and an output configured to generate a pulse width modulated (PWM) signal; an H-bridge including an input coupled to an output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal, wherein the deadtime compensation circuit is coupled between the output of the H-bridge and the input of the pulse width modulator, and wherein the deadtime compensation circuit includes: a first signal subtractor including a first input coupled to the output of the H-bridge, and a second input coupled to the output of the pulse width modulator; a low pass filter including an input coupled to an output of the first signal subtractor; and a signal scalar including an input coupled to an output of the low pass filter and an output coupled to the input of the pulse width modulator.

Aspect 2: The apparatus of aspect 1, wherein the signal scalar is configured to scale a signal at the output of the low pass filter by substantially one over a pulse width modulation gain of the pulse width modulator.

Aspect 3: The apparatus of aspect 1 or 2, further including a second signal subtractor including a first input configured to receive a second signal based on the input signal, a second input coupled to the output of the signal scalar, and an output configured to produce the first signal.

Aspect 4: The apparatus of aspect 3, further including a loop filter configured to generate the second signal based on a difference between the output signal and the input signal.

Aspect 5: The apparatus of aspect 4, further including a third signal subtractor including a first input configured to receive the input signal, a second input configured to receive the output signal, and an output configured to generate a third signal based on the difference between the output signal and the input signal, wherein the loop filter is configured to generate the second signal based on the third signal.

Aspect 6: The apparatus of any one of aspects 1-5, further including an aliasing error compensation circuit including inputs coupled to the input and the output of the pulse width modulator, respectively, and an output coupled to the input of the pulse width modulator.

Aspect 7: The apparatus of aspect 6, wherein the aliasing error compensation circuit is configured to generate a compensation signal based on the first signal and the PWM signal, wherein the first signal is based on the compensation signal and the input signal.

Aspect 8: The apparatus of aspect 6 or 7, wherein the aliasing error compensation circuit includes: a first low pass filter (LPF) including an input coupled to the input of the pulse width modulator; a second LPF including an input coupled to the output of the pulse width modulator; a signal scalar including an input coupled to an output of the second LPF; a second signal subtractor including inputs coupled to outputs of the first LPF and the signal scalar; and a third signal subtractor including a first input configured to receive a second signal, a second input coupled to an output of the second signal subtractor, and an output coupled to the input of the pulse width modulator.

Aspect 9: The apparatus of any one of aspects 1-8, wherein the PWM signal includes a differential PWM signal, wherein the output signal includes a differential output signal, and wherein the deadtime compensation circuit includes an operational amplifier including a differential input configured to receive the differential PWM and output signals, and feedback resistors and capacitors coupled in parallel between a differential output and the differential input of the operational amplifier.

Aspect 10: The apparatus of any one of aspects 1-9, wherein the deadtime compensation circuit includes a pulse modification circuit including an input coupled to the output of the pulse width modulator and an output coupled to an input of an H-bridge driver, wherein the H-bridge driver includes an output coupled to the input of the H-bridge.

Aspect 11: The apparatus of aspect 10, wherein the deadtime compensation circuit further includes a current polarity sensor configured to generate a current polarity signal indicative of a direction of a load current through the load, wherein the current polarity sensor includes an output, at which the current polarity signal is generated, coupled to an input of the pulse modification circuit.

Aspect 12: The apparatus of aspect 11, wherein the H-bridge includes: a positive-portion configured to generate the load current flowing through the load in a positive direction; and a negative-portion configured to generate the load current flowing through the load in a negative direction.

Aspect 13: The apparatus of aspect 12, wherein the PWM signal includes first and second PWM signals, wherein the pulse modification circuit is configured to delay a first transition of a first PWM signal to generate a first modified PWM signal based on the current polarity signal indicating the load current flowing in the positive direction, wherein the H-bridge driver is configured to generate a first control signal based on the first modified PWM signal, and wherein the positive-portion of the H-bridge is configured to generate the load current based on the first control signal.

Aspect 14: The apparatus of aspect 13, wherein the pulse modification circuit is configured to delay a second transition of the second PWM signal to generate a second modified PWM signal based on the current polarity signal indicating the load current flowing in the positive direction, wherein the H-bridge driver is configured to generate a second control signal based on the second modified PWM signal, and wherein the positive-portion of the H-bridge is configured to generate the load current based on the second control signal.

Aspect 15: The apparatus of any one of aspects 12-14, wherein the PWM signal includes first and second PWM signals, wherein the pulse modification circuit is configured to delay a first transition of a first PWM signal to generate a first modified PWM signal based on the current polarity signal indicating the load current flowing in the negative direction, wherein the H-bridge driver is configured to generate a first control signal based on the first modified PWM signal, and wherein the negative-portion of the H-bridge is configured to generate the load current based on the first control signal.

Aspect 16: The apparatus of aspect 15, wherein the pulse modification circuit is configured to delay a second transition of the second PWM signal to generate a second modified PWM signal based on the current polarity signal indicating the load current flowing in the negative direction, wherein the H-bridge driver is configured to generate a second control signal based on the second modified PWM signal, and wherein the negative-portion of the H-bridge is configured to generate the load current based on the second control signal.

Aspect 17: The apparatus of any one of aspects 1-16, wherein the deadtime compensation circuit includes an offset signal generating circuit configured to generate an offset signal, wherein the offset signal generating circuit includes an output, at which the offset signal is generated, coupled to an input of the pulse width modulator.

Aspect 18: The apparatus of aspect 17, wherein the pulse width modulator includes an output coupled to an input of an H-bridge driver, wherein the H-bridge driver includes an output coupled to the input of the H-bridge.

Aspect 19: The apparatus of aspect 17 or 18, wherein the H-bridge includes: a positive-portion configured to generate a load current flowing through the load in a positive direction; and a negative-portion configured to generate the load current flowing through the load in a negative direction.

Aspect 20: The apparatus of aspect 19, wherein the offset signal generating circuit is configured to generate the offset signal to delay a transition in the PWM signal based on the load current flowing in the positive direction, wherein the H-bridge driver is configured to generate a control signal based on the PWM signal, and wherein the positive-portion of the H-bridge is configured to generate the load current based on the control signal.

Aspect 21: The apparatus of aspect 19 or 20, wherein the offset signal generating circuit is configured to generate the offset signal to delay a transition in the PWM signal based on the load current flowing in the negative direction, wherein the H-bridge driver is configured to generate a control signal based on the PWM signal, and wherein the negative-portion of the H-bridge is configured to generate the load current based on the control signal.

Aspect 22: A method, including: generating a pulse width modulated signal based on an input signal; generating an output signal across a load based on the pulse width modulated signal; and modifying the output signal to compensate for deadtime distortion in the output signal.

Aspect 23: The method of aspect 22, wherein modifying the output signal includes: generating a first signal based on a difference between the output signal and the pulse width modulated signal; filtering the first signal to generate a second signal; scaling the second signal to generate a third signal; and generating a fourth signal based on a difference between the third signal and the input signal, wherein the pulse width modulated signal is based on the fourth signal.

Aspect 24: The method of aspect 22 or 23, wherein modifying the output signal includes modifying the pulse width modulated signal.

Aspect 25: The method of any one of aspects 22-24, wherein modifying the output signal includes modifying the generation of the pulse width modulated signal.

Aspect 26: An apparatus, including: means for generating a pulse width modulated signal based on an input signal; means for generating an output signal across a load based on the pulse width modulated signal; and means for modifying the output signal to compensate for deadtime distortion in the output signal.

Aspect 27: The apparatus of aspect 26, wherein modifying the output signal includes: means for generating a first signal based on a difference between the output signal and the pulse width modulated signal; means for filtering the first signal to generate a second signal; means for scaling the second signal to generate a third signal; and means for generating a fourth signal based on a difference between the third signal and the input signal, wherein the pulse width modulated signal is based on the fourth signal.

Aspect 28: The apparatus of aspect 26 or 27, wherein means for modifying the output signal includes means for modifying the pulse width modulated signal or the generation of the pulse width modulated signal.

Aspect 29: An apparatus, including: a pulse width modulator including an input configured to receive a first signal based on an input signal, and an output configured to generate a pulse width modulated (PWM) signal; an H-bridge including an input coupled to an output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal, wherein the deadtime compensation circuit includes a pulse modification circuit including an input coupled to the output of the pulse width modulator and an output coupled to an input of an H-bridge driver, wherein the H-bridge driver includes an output coupled to the input of the H-bridge.

Aspect 30: The apparatus of aspect 29, wherein the deadtime compensation circuit further includes a current polarity sensor configured to generate a current polarity signal indicative of a direction of a load current through the load, wherein the current polarity sensor includes an output, at which the current polarity signal is generated, coupled to an input of the pulse modification circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
a pulse width modulator including an input configured to receive a first signal based on an input signal, and an output configured to generate a pulse width modulated (PWM) signal;
an H-bridge including an input coupled to the output of the pulse width modulator and an output coupled to a load, wherein the H-bridge is configured to generate an output signal across the load based on the PWM signal; and a deadtime compensation circuit coupled to the H-bridge, wherein the deadtime compensation circuit is configured to compensate for deadtime distortion in the output signal, wherein the deadtime compensation circuit is coupled between the output of the H-bridge and the input of the pulse width modulator, and wherein the deadtime compensation circuit comprises:
a first signal subtractor including a first input coupled to the output of the H-bridge, and a second input coupled to the output of the pulse width modulator;
a low pass filter including an input coupled to an output of the first signal subtractor; and
a signal scalar including an input coupled to an output of the low pass filter and an output coupled to the input of the pulse width modulator.

2. The apparatus of claim 1, wherein the signal scalar is configured to scale a signal at the output of the low pass filter by substantially one over a pulse width modulation gain of the pulse width modulator.

3. The apparatus of claim 2, further comprising a second signal subtractor including a first input configured to receive a second signal based on the input signal, a second input coupled to the output of the signal scalar, and an output configured to produce the first signal.

4. The apparatus of claim 3, further comprising a loop filter configured to generate the second signal based on a difference between the output signal and the input signal.

5. The apparatus of claim 4, further comprising a third signal subtractor including a first input configured to receive the input signal, a second input configured to receive the output signal, and an output configured to generate a third signal based on the difference between the output signal and the input signal, wherein the loop filter is configured to generate the second signal based on the third signal.

6. The apparatus of claim 1, further comprising an aliasing error compensation circuit including inputs coupled to the input and the output of the pulse width modulator, respectively, and an output coupled to the input of the pulse width modulator.

7. The apparatus of claim 6, wherein the aliasing error compensation circuit is configured to generate a compensation signal based on the first signal and the PWM signal, wherein the first signal is based on the compensation signal and the input signal.

8. The apparatus of claim 6, wherein the aliasing error compensation circuit comprises:
a first low pass filter (LPF) including an input coupled to the input of the pulse width modulator;
a second LPF including an input coupled to the output of the pulse width modulator;
a signal scalar including an input coupled to an output of the second LPF;
a second signal subtractor including inputs coupled to outputs of the first LPF and the signal scalar; and
a third signal subtractor including a first input configured to receive a second signal, a second input coupled to an output of the second signal subtractor, and an output coupled to the input of the pulse width modulator.

9. The apparatus of claim 1, wherein the PWM signal comprises a differential PWM signal, wherein the output signal comprises a differential output signal, and wherein the deadtime compensation circuit comprises an operational amplifier including a differential input configured to receive the differential PWM and output signals, and feedback resistors and capacitors coupled in parallel between a differential output and the differential input of the operational amplifier.

10. The apparatus of claim 1, wherein the deadtime compensation circuit comprises a pulse modification circuit including an input coupled to the output of the pulse width modulator and an output coupled to an input of an H-bridge driver, wherein the H-bridge driver includes an output coupled to the input of the H-bridge.

11. The apparatus of claim 10, wherein the deadtime compensation circuit further comprises a current polarity sensor configured to generate a current polarity signal indicative of a direction of a load current through the load, wherein the current polarity sensor includes an output, at which the current polarity signal is generated, coupled to an input of the pulse modification circuit.

12. The apparatus of claim 11, wherein the H-bridge comprises:
a positive-portion configured to generate the load current flowing through the load in a positive direction; and
a negative-portion configured to generate the load current flowing through the load in a negative direction.

13. The apparatus of claim 12, wherein the PWM signal comprises first and second PWM signals, wherein the pulse modification circuit is configured to delay a first transition of a first PWM signal to generate a first modified PWM signal based on the current polarity signal indicating the load current flowing in the positive direction, wherein the H-bridge driver is configured to generate a first control signal based on the first modified PWM signal, and wherein the positive-portion of the H-bridge is configured to generate the load current based on the first control signal.

14. The apparatus of claim 13, wherein the pulse modification circuit is configured to delay a second transition of the second PWM signal to generate a second modified PWM signal based on the current polarity signal indicating the load current flowing in the positive direction, wherein the H-bridge driver is configured to generate a second control signal based on the second modified PWM signal, and wherein the positive-portion of the H-bridge is configured to generate the load current based on the second control signal.

15. The apparatus of claim 12, wherein the PWM signal comprises first and second PWM signals, wherein the pulse modification circuit is configured to delay a first transition of a first PWM signal to generate a first modified PWM signal based on the current polarity signal indicating the load current flowing in the negative direction, wherein the H-bridge driver is configured to generate a first control signal based on the first modified PWM signal, and wherein the negative-portion of the H-bridge is configured to generate the load current based on the first control signal.

16. The apparatus of claim 15, wherein the pulse modification circuit is configured to delay a second transition of the second PWM signal to generate a second modified PWM signal based on the current polarity signal indicating the load current flowing in the negative direction, wherein the H-bridge driver is configured to generate a second control signal based on the second modified PWM signal, and wherein the negative-portion of the H-bridge is configured to generate the load current based on the second control signal.

17. The apparatus of claim 1, wherein the deadtime compensation circuit comprises an offset signal generating circuit configured to generate an offset signal, wherein the offset signal generating circuit includes an output, at which the offset signal is generated, coupled to an input of the pulse width modulator.

18. The apparatus of claim 17, wherein the pulse width modulator includes an output coupled to an input of an H-bridge driver, wherein the H-bridge driver includes an output coupled to the input of the H-bridge.

19. The apparatus of claim 18, wherein the H-bridge comprises:
   a positive-portion configured to generate a load current flowing through the load in a positive direction; and
   a negative-portion configured to generate the load current flowing through the load in a negative direction.

20. The apparatus of claim 19, wherein the offset signal generating circuit is configured to generate the offset signal to delay a transition in the PWM signal based on the load current flowing in the positive direction, wherein the H-bridge driver is configured to generate a control signal based on the PWM signal, and wherein the positive-portion of the H-bridge is configured to generate the load current based on the control signal.

21. The apparatus of claim 19, wherein the offset signal generating circuit is configured to generate the offset signal to delay a transition in the PWM signal based on the load current flowing in the negative direction, wherein the H-bridge driver is configured to generate a control signal based on the PWM signal, and wherein the negative-portion of the H-bridge is configured to generate the load current based on the control signal.

22. A method, comprising:
   generating a pulse width modulated signal based on an input signal;
   generating an output signal across a load based on the pulse width modulated signal; and
   modifying the output signal to compensate for deadtime distortion in the output signal, wherein modifying the output signal comprises modifying the pulse width modulated signal or modifying the generation of the pulse width modulated signal.

23. The method of claim 22, wherein modifying the output signal comprises:
   generating a first signal based on a difference between the output signal and the pulse width modulated signal;
   filtering the first signal to generate a second signal;
   scaling the second signal to generate a third signal; and
   generating a fourth signal based on a difference between the third signal and the input signal, wherein the pulse width modulated signal is based on the fourth signal.

24. An apparatus, comprising:
   means for generating a pulse width modulated signal based on an input signal;
   means for generating an output signal across a load based on the pulse width modulated signal; and
   means for modifying the output signal to compensate for deadtime distortion in the output signal, wherein means for modifying the output signal comprises means for modifying the pulse width modulated signal or the generation of the pulse width modulated signal.

25. The apparatus of claim 24, wherein modifying the output signal comprises:
   means for generating a first signal based on a difference between the output signal and the pulse width modulated signal;
   means for filtering the first signal to generate a second signal;
   means for scaling the second signal to generate a third signal; and
   means for generating a fourth signal based on a difference between the third signal and the input signal, wherein the pulse width modulated signal is based on the fourth signal.

26. An apparatus, comprising:
   a pulse width modulator including an input configured to receive a first signal based on an input signal, and an output configured to generate a pulse width modulated (PWM) signal;
   an H-bridge including an input coupled to the output of the pulse width modulator and an output coupled to a load, wherein the H-bridge is configured to generate an output signal across the load based on the PWM signal; and
   a deadtime compensation circuit coupled to the H-bridge, wherein the deadtime compensation circuit is configured to compensate for deadtime distortion in the output signal, wherein the deadtime compensation circuit comprises a pulse modification circuit including an input coupled to the output of the pulse width modulator and an output coupled to an input of an H-bridge driver, wherein the H-bridge driver includes an output coupled to the input of the H- bridge.

27. The apparatus of claim 26, wherein the deadtime compensation circuit further comprises a current polarity sensor configured to generate a current polarity signal indicative of a direction of a load current through the load, wherein the current polarity sensor includes an output, at which the current polarity signal is generated, coupled to an input of the pulse modification circuit.

* * * * *